US011865782B2

(12) United States Patent
Rubin Ben Haim et al.

(10) Patent No.: US 11,865,782 B2
(45) Date of Patent: Jan. 9, 2024

(54) PRINTING SYSTEM AND WRITING MODULE THEREOF

(71) Applicant: LANDA LABS (2012) LTD., Rehovot (IL)

(72) Inventors: Nir Rubin Ben Haim, Hod HaSharon (IL); Michael Nagler, Tel Aviv (IL); Abraham Keren, Maccabim Reut (IL); Ofer Aknin, Petach Tikva (IL); Benzion Landa, Nes Ziona (IL)

(73) Assignee: Landa Labs (2012) LTD., Rehovot (IL)

( * ) Notice: Subject to any disclaimer, the term of this patent is extended or adjusted under 35 U.S.C. 154(b) by 47 days.

(21) Appl. No.: 16/635,162

(22) PCT Filed: Aug. 8, 2018

(86) PCT No.: PCT/IB2018/055971
§ 371 (c)(1),
(2) Date: Jan. 29, 2020

(87) PCT Pub. No.: WO2019/030694
PCT Pub. Date: Feb. 14, 2019

(65) Prior Publication Data
US 2020/0406544 A1    Dec. 31, 2020

(30) Foreign Application Priority Data

Aug. 8, 2017  (GB) ...................................... 1712726

(51) Int. Cl.
*B29C 64/268*    (2017.01)
*B33Y 30/00*    (2015.01)
(Continued)

(52) U.S. Cl.
CPC ............ *B29C 64/268* (2017.08); *B33Y 30/00* (2014.12); *B41J 2/0057* (2013.01); *B41J 2/455* (2013.01);
(Continued)

(58) Field of Classification Search
CPC ..... B29C 64/268; B33Y 30/00; G02B 3/0087; G02B 3/06; G02B 19/0009;
(Continued)

(56) References Cited

U.S. PATENT DOCUMENTS 5,572,540 A * 11/1996 Cheng .................. H01S 5/0262
372/38.07
5,600,363 A    2/1997 Toshihiro et al.
(Continued)

FOREIGN PATENT DOCUMENTS

JP         S61118273 A    6/1986
JP         2004-122512 A  4/2004
(Continued)

OTHER PUBLICATIONS

Dummer et al., "Computed radiography imaging based on high-density 670-nm VCSEL arrays," Proc. SPIE 7557, Multimodal Biomedical Imaging V, 75570H (Feb. 23, 2010); https://doi.org/10.1117/12.846312 (Year: 2010).*
(Continued)

*Primary Examiner* — Peter Radkowski
(74) *Attorney, Agent, or Firm* — Shalom Wertsberger; Saltamar Innovations

(57) ABSTRACT

A printing system is disclosed which comprises a writing module, and a member having an imaging surface configured to carry a polymer and movable relative to the writing module. The writing module is configured to direct onto the imaging surface a plurality of individually controllable light beams that are spaced from one another in a direction
(Continued)

transverse to the direction of movement of the imaging surface, incidence of a light beam on a spot on the imaging surface serving to soften or liquefy the polymer carried by the imaging surface at the spot. The polymer softened or liquefied at the spot can transfer to a substrate or serve as an adhesive on the imaging surface. The writing module comprises a plurality of integrated electronic modules each having an array of individually controllable light sources, each light source producing a respective one of the light beams. In the invention, each light source comprises at least two Vertical-Cavity Surface-Emitting Laser (VCSEL) light-emitting semiconductor junctions connected in series with one another and configured to direct light onto the imaging surface at the same spot as one another.

18 Claims, 12 Drawing Sheets

(51) Int. Cl.

| | | |
|---|---|---|
| B41J 2/005 | (2006.01) | |
| B41J 2/455 | (2006.01) | |
| G02B 3/00 | (2006.01) | |
| G02B 3/06 | (2006.01) | |
| G02B 19/00 | (2006.01) | |
| H01S 5/024 | (2006.01) | |
| H01S 5/183 | (2006.01) | |
| H01S 5/40 | (2006.01) | |
| H01S 5/42 | (2006.01) | |

(52) U.S. Cl.
CPC ............ *G02B 3/0087* (2013.01); *G02B 3/06* (2013.01); *G02B 19/0009* (2013.01); *G02B 19/0047* (2013.01); *H01S 5/02469* (2013.01); *H01S 5/1833* (2013.01); *H01S 5/18311* (2013.01); *H01S 5/4018* (2013.01); *H01S 5/426* (2013.01)

(58) Field of Classification Search
CPC ..... G02B 19/0047; B41J 2/0057; B41J 2/455; H01S 5/02469; H01S 5/18311; H01S 5/1833; H01S 5/4018; H01S 5/426
See application file for complete search history.

(56) References Cited

U.S. PATENT DOCUMENTS

| | | | |
|---|---|---|---|
| 6,236,670 B1 | 5/2001 | Nagle et al. | |
| 6,487,230 B1* | 11/2002 | Boucart | H01S 5/18311 |
| | | | 257/E33.069 |
| 6,914,231 B1* | 7/2005 | Stone | G02B 6/4206 |
| | | | 250/216 |
| 6,936,486 B2 | 8/2005 | Cheng et al. | |
| 7,002,613 B2* | 2/2006 | Beier | B41C 1/05 |
| | | | 347/238 |
| 7,654,626 B2 | 2/2010 | Silverbrook et al. | |
| 7,796,885 B2* | 9/2010 | Dress | H04B 10/803 |
| | | | 398/66 |
| 7,936,953 B2* | 5/2011 | Johnson | H05K 1/0274 |
| | | | 385/14 |
| 8,368,735 B2* | 2/2013 | Soulliaert | G03G 15/326 |
| | | | 347/238 |
| 8,749,151 B2 | 6/2014 | Khalid | |
| 8,937,759 B2* | 1/2015 | Holmes | G03H 1/0005 |
| | | | 359/279 |
| 9,529,325 B2* | 12/2016 | Holmes | G02F 1/29 |
| 10,061,200 B2 | 8/2018 | Rubin Ben Haim et al. | |
| 10,336,059 B2 | 7/2019 | Landa et al. | |
| 10,509,128 B1* | 12/2019 | Lee | G01S 17/42 |
| 10,606,191 B2 | 3/2020 | Landa et al. | |
| 10,723,139 B2* | 7/2020 | Mattes | B23K 26/342 |
| 10,913,835 B2 | 2/2021 | Landa et al. | |
| 11,047,779 B2 | 8/2021 | Landa et al. | |
| 11,104,779 B2* | 8/2021 | Landa | C09C 3/10 |
| 2002/0122636 A1* | 9/2002 | Anderson | G02B 6/4269 |
| | | | 385/89 |
| 2003/0057363 A1* | 3/2003 | Anderson | G02B 6/4249 |
| | | | 250/227.11 |
| 2004/0046860 A1* | 3/2004 | Beier | B41F 31/00 |
| | | | 347/238 |
| 2005/0018972 A1* | 1/2005 | Anderson | G02B 6/4292 |
| | | | 385/53 |
| 2006/0285566 A1 | 12/2006 | Ukei | |
| 2007/0153867 A1 | 7/2007 | Mueller | |
| 2008/0008472 A1* | 1/2008 | Dress | H04B 10/803 |
| | | | 398/66 |
| 2008/0013959 A1* | 1/2008 | Ishigami | G02B 6/4204 |
| | | | 398/135 |
| 2009/0115833 A1* | 5/2009 | Soulliaert | G03G 15/04054 |
| | | | 347/238 |
| 2009/0162004 A1* | 6/2009 | Johnson | H05K 1/0274 |
| | | | 385/14 |
| 2010/0224318 A1* | 9/2010 | Morita | B05C 1/0834 |
| | | | 156/291 |
| 2013/0077978 A1* | 3/2013 | Duis | G02B 6/4246 |
| | | | 398/139 |
| 2015/0097906 A1* | 4/2015 | Beier | B41M 5/0017 |
| | | | 347/103 |
| 2016/0072258 A1 | 3/2016 | Seurin et al. | |
| 2016/0159110 A1* | 6/2016 | Beier | B41J 11/002 |
| | | | 347/102 |
| 2016/0279707 A1* | 9/2016 | Mattes | B29C 64/393 |
| 2017/0075226 A1 | 3/2017 | Nagler et al. | |
| 2017/0080454 A1* | 3/2017 | Hidaka | C09J 5/00 |

FOREIGN PATENT DOCUMENTS

| | | |
|---|---|---|
| JP | 2007-251031 A | 9/2007 |
| JP | 2013165188 A | 8/2013 |
| JP | 2016-078238 A | 5/2016 |
| WO | WO2016/189510 A1 | 12/2016 |

OTHER PUBLICATIONS

Chua et al., Independently Addressable VCSEL Arrays on 3-m Pitch, IEEE Photonics Technology Letters, vol. 10, No. 7, Jul. 1998 (Year: 1998).*

Hergenhan et al., Coherent coupling of vertical-cavity surface-emitting laser arrays and efficient beam combining by diffractive optical elements: concept and experimental verification, Applied Optics, V. 42, N. 9, 2003 (Year: 2003).*

Seurin et al., High-power high-efficiency 2D VCSEL arrays, Proc. SPIE 6908, Vertical-Cavity Surface-Emitting Lasers XII, 690808 (Jan. 29, 2008); doi:10.1117/12.774126 (Year: 2008).*

Song, Deqiang, Misalignment corrections in optical interconnects, Dissertation, UCSD, 2006 (Year: 2006).*

Mitin et al., Tunnel-junction-connected distributed-feedback vertical-cavity surface-emitting laser. Applied Physics Letters. 73. 1475-1477. 10.1063/1.122217. 1998 (Year: 1998).*

Stringham, Gary, 3D vs. 2D Printing: Similarities in Technical Details, 2014, available at https://www.garystringham.com/3d-vs-2d-printing-similarities-technical-details/ (Year: 2014).*

Lee et al., Transfer printing of metal nanoring and nanodot arrays for use in catalytic reactions, Chem. Commun., 2014, 50, 8472 (Year: 2014).*

* cited by examiner

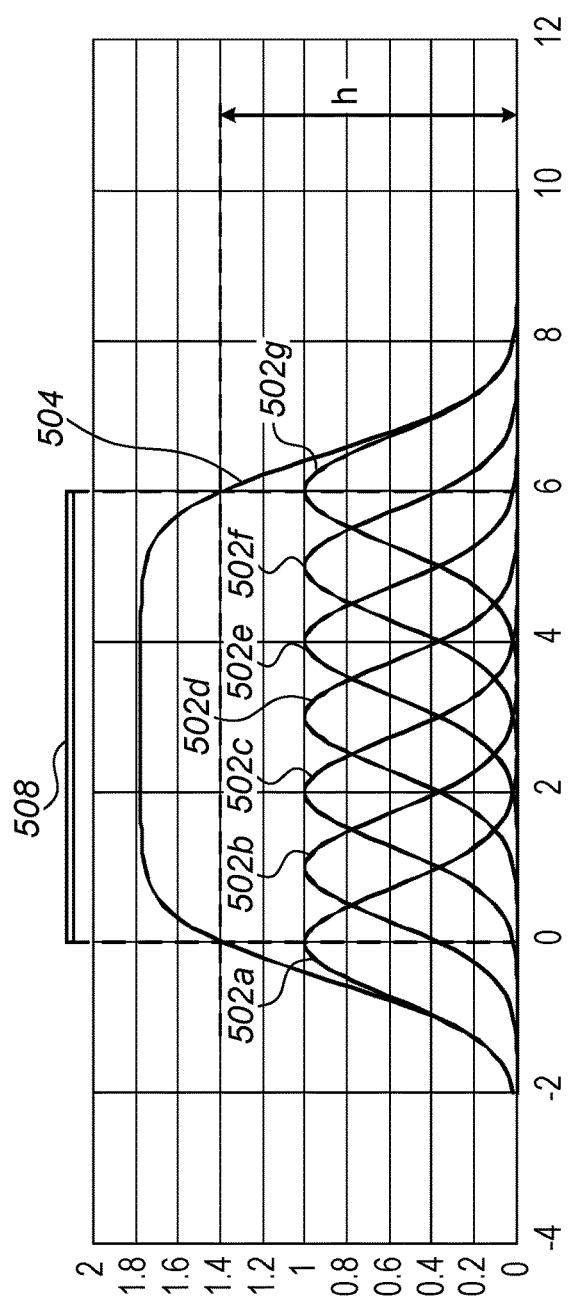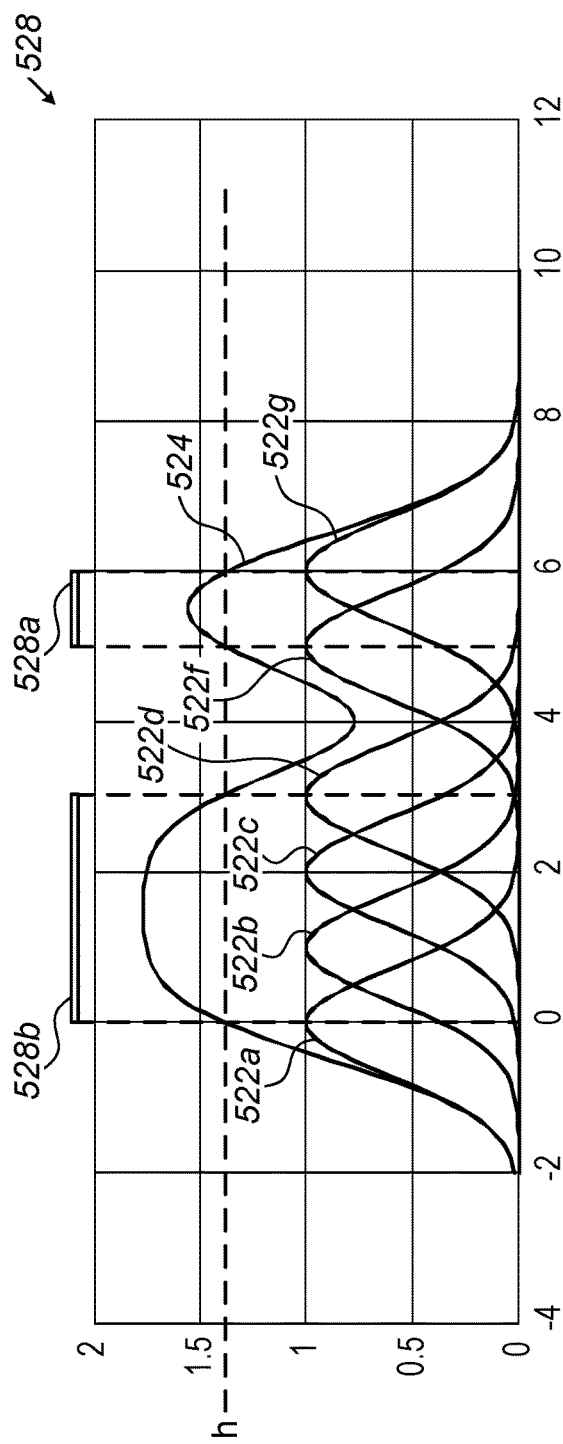
FIG. 5A
FIG. 5B

PRINTING SYSTEM AND WRITING MODULE THEREOF

This application is a national phase application of PCT application No. PCT/IB2018/055971, internationally filed on 8 Aug. 2018, which in turns claims Paris Convention priority from GB 1712726.7, filed on 8 Aug. 2017, the contents of which are incorporated by reference as if fully set forth herein.

FIELD

The present disclosure relates to a digital printing system having a writing module that includes a plurality of light sources and seeks to mitigate problems caused by heat generation by high power writing modules that use Vertical Cavity Surface Emitting Lasers (VCSELs) as light sources.

BACKGROUND

Digital printing offers the capability of printing a desired item without the use of a physical template. In digital two-dimensional (2D) printing, an image, primarily stored in a digital storage, is transferred to the substrate via control of ink deposition to form the printed item thereon. The image transfer may be effected either directly onto the substrate or indirectly, to an intermediate medium such as a blanket, from which the image is transferred to the substrate. In three-dimensional (3D) printing (assumed here to be "additive") the printed object is generated layer after layer, each such layer being printed as a semi 2D print item on top of a previous layer (a semi 2D print item meaning a print item having a small, but not vanishing, thickness). In a recently disclosed printing technology, the process of transferring an image to ultimately form a printout on the substrate involves a step of radiating a structured light beam on a target surface so as to form the desired image thereon. The target surface may be in some examples the printing substrate or an intermediate transfer member (sometimes termed a blanket), or any material found on such printing substrate or intermediate transfer member, which may be modified by such radiation.

WO 2016/189512 to the same Applicant (hereinafter '512) discloses a printing apparatus for printing a film made of a polymeric material onto a surface of a substrate. The printing apparatus comprises a movable transfer member having an imaging surface, which is configured to be coated, during operation, with a monolayer of particles comprising a thermoplastic polymer and when desired a coloring agent. According to some embodiments of '512, the printing apparatus further comprises an imaging device for projecting individually controllable laser beams onto the imaging surface, as the imaging surface moves in a reference X-direction relative to the device. The imaging device includes a plurality of semiconductor chips or dies having a plurality of laser beam emitting elements, mounted on a support in such a manner that, when activated continuously, the emitted laser beams trace across the imaging surface a set of parallel lines that extend in the X-direction, and are substantially uniformly spaced in the Y-direction. According to some embodiments of '512, the laser beam emitting elements are vertical-cavity surface-emitting lasers (VCSELs or VCSEL elements), and the semiconductor chips are VCSEL chip arrays. The signals supplied to the semiconductor chips for the activation of one or more laser elements are synchronized with the movement of the transfer member, so as to allow a high-resolution image to be traced on the imaging surface by the emitted laser beams. During operation, selected regions of the coated imaging surface are exposed to laser beams of activated laser elements thereby rendering the particles within the selected regions tacky. By pressing the coated imaging surface and the surface of the substrate against one another, the tacky film formed on the selected regions of the imaging surface may be transferred to the surface of the substrate.

It is noted that current VCSEL technology is based mostly on gallium arsenide (GaAs) semiconductors (although exceptions exist), and a great percentage of commercially available VCSELs are correspondingly configured to radiate in the Infra-Red (IR) range. Hence, the terms "light" or "radiation" herein, when applied to light sources (e.g., VCSELs), are meant to include all electromagnetic (EM) radiation capable of softening a polymer, even if such radiation is not in the visible range of the electromagnetic spectrum. A material (e.g., a thermoplastic polymer) exposed to such radiation is said to be irradiated or radiated.

The technology of laser diodes, and particularly VCSELs, is undergoing continuous progress, and currently dense arrays of high-power laser beam emitting elements on a single die are readily available. U.S. 2016/0072258 discloses a projection apparatus for generating a high-resolution structured illumination pattern. The projection apparatus comprises an optical source including one or more VCSEL arrays, wherein each VCSEL array includes at least 5,000, but no more than 500,000 VCSEL devices each separated from an adjacent VCSEL device by a distance that is no more than 5 micrometer ($\mu$m). The projection apparatus is configured to generate a desired one or more high resolution structured illumination patterns, wherein each VCSEL array has an area proportional to the size of the VCSEL array. The projection apparatus further comprises a projection device including at least one optical element to magnify and project the desired one or more illumination pattern on to an area distal to the optical source.

SUMMARY

According to an aspect of the present invention, there is provided a printing system as hereinafter set forth in claim 1 of the appended claims.

Embodiments of the invention described herein are concerned with electric current mitigation and heat mitigation in writing modules that use VCSELs as light sources.

When a digital printing process includes a step of using radiation to directly modify the physical properties of a polymeric material on an imaging surface, a considerable amount of energy is typically involved in the step whether the radiated material modified in the process (e.g., softened or liquified) is to further transfer to a printing substrate or already coating it. As an illustrative non-limiting example, softening or liquefying an initially solid layer of polymer may be considered. In such a case, a region covered with a solid layer of the polymer, including for instance a layer formed by particles of the polymer, may be radiated to modify the polymer and/or particles thereof to form a tacky and/or liquid ink, for transferring the softened or liquified material onto the printing substrate. It may be assumed that a transfer member carrying the layer of polymer is displaced along an X direction while a plurality of light sources distributed along the Y direction are employed to radiate the required energy.

Assuming a polymer having a volumetric heat capacity of about $10^{-12}$ J/$\mu$m$^3$ °C. (here J stands for Joule, $\mu$m stands for micrometers and ° C. stands for degrees Celsius), and a layer thickness of about 2 µm, and further assuming that the printing is done with a hypothetical square pixel having edges of 50 µm and at a printing speed of 1 m/sec, then to raise the temperature of the polymer by 100° C., each pixel requires about 10 mW of power (the actual energy spent on one pixel being the power multiplied by the time duration of the pixel). Assuming further an energy transfer efficiency of about 20% for the ratio between the energy used for modifying the material and the energy radiated from the source, then 50 mW of radiated power is required at the light source for every 50 µm width stripe of printed substrate across the Y direction—corresponding to a radiated power density of about 20 MW/m² from the light source.

If VCSELs are used for the light sources, the VCSELs being distributed along the Y direction so that each VCSEL is associated with a single stripe of pixels (the stripe extending along the X direction), then the electric power consumed by each VCSEL is determined by the VCSEL's radiation efficiency (also termed power conversion efficiency). For illustrative purposes, supposing that the VCSELs radiation efficiency is about 30%, then 150 mW of power should be driven to each VCSEL in order to achieve aforesaid exemplary radiated power.

It will be appreciated by the person skilled in the art that the electric power that should preferably be supplied to each light source of a printing system in practice may differ from the illustrative exemplary values given above, which depend on the specific assumptions made above. For instance: the delivered electric power varies linearly with the specific energy required to modify the material to be transferred (e.g., the volumetric heat capacity of the material), and with the volume of the material on a unit area (e.g., the thickness of the material layer); it is further linearly dependent on the printing speed of the printing system; and the delivered power is inversely proportional to the transfer efficiency of radiation energy to heat of the modified material, and to the radiation efficiency of the light source (e.g., the radiation efficiency of the VCSEL). Thus, it may be envisaged that printing systems using the principles described hereinabove may use light sources radiating at a lower or higher power density than that stated above—e.g., at 30 or 40 or 50 MW/m² or even at 70 or 100 or 200 or even 400 MW/m² (the last exemplary value being valid if printing is done, for example, at a printing speed of 5 m/sec, a pixel width of 25 µm, the volumetric heat capacity of the polymer is double and the transfer efficiency is half of the values assumed above).

Delivering and consuming such power at such spatial density poses several barriers on actual implementation of a printing system, as is detailed and explained below. Such barriers may be associated specifically with the heat generated by the light sources and their driving electric circuitry; the electric current density required to drive the light sources; and the switching rate of the light sources. The switching rate, in turn, draws constraints on the driving electronic circuitry itself, the heat dissipated therewith and the physical distance over which the driving signals may be conducted between the driving circuitry and the light sources. It should be noted in this regard that the switching rate discussed above is linearly dependent on the printing speed of the printing system, and inversely proportional to the pixel dimension. In the illustrative example given above, a pixel size/length of 50 µm and a printing speed of 1 m/sec implies a switching rate of about 20 kHz, which generally requires driving circuitry having a bandwidth greater by an order of magnitude namely of roughly 200 kHz. It is noted that a smaller pixel size or a higher printing speed may respectively require a higher switching rate, such as 40 kHz or 80 kHz or 150 kHZ or even about 300 kHz, in a printing system having a pixel size of about 25 µm and a printing speed of 8 m/sec.

Contemporary VCSEL technology is based primarily on p-doped and n-doped GaAs junctions (possibly with InGaAs quantum wells defined between AlGaAs confinement walls within the active region). The potential barrier of a GaAs junction is about 1.2V, and accordingly the typical lasing operational voltage drop on a GaAs junction is in the range of 1.2-4V. For example, a commercial single-mode VCSEL may provide about 100 mW of output light at an operating voltage of about 3V and an operating current of about 300 mA. It should be noted that the resulting efficiency of about 10% is typical to the relatively-high current implied working point, because power conversion efficiency in VCSELs tends to decrease when the current increases beyond an optimum level. Such a working point is therefore far less than optimal for several reasons: first, the relatively-low efficiency implies a relatively-high heat generation during operation—about 1 W of heat generated by each VCSEL during the generation of 100 mW of light. The person skilled in the art will appreciate that such heat must be removed from the surroundings of the VCSELs, to prevent intolerable temperature rise thereof. Second, driving 300 mA of current to a multitude of VCSELs that are distributed along the Y direction at spacings of, for example, about 50 µm as above assumed implies very high current densities in the conductors leading to the VCSELs. Such current densities may add a considerable amount of heat generation (to the heat generated by the VCSELs themselves) in the immediate surroundings of the VCSELs, thereby adding more difficulty to the problem of excess heat removal and/or may require a complex configuration of conductors for conducting the current, such as conductors arranged in several layers. And third, switching the VCSELs requires high-current, high-rate drivers which in turn require power switches in the output stage of the driver, meaning relatively large components that require relatively large mounting area. Since mounting surface near the VCSELs is at a premium, a demand for large mounting area implies that at least some of the driving electricity is mounted distantly to the VCSELs, which require, in turn, relatively long conducting lines between the driving electricity and the VCSELs. Clearly, long conducting lines carrying high current densities at high switching rates affect negatively at least the quality of the driving signals, namely limit the signals bandwidth, and also contribute to increase the electrical resistance of the conducting lines between the drivers and the VCSELs, thereby increasing heat generation near the VCSELs.

More detailed explanations of the constraints and limitations imposed by the combined requirements as detailed above on the overall electrical and physical configuration of the VCSELs and the driving electronics in such a printing system are provided in the Detailed Description.

With a view to reducing the current requirement of the light sources, each light source in the present invention is formed as a cascade of at least two Vertical-Cavity Surface-Emitting Laser (VCSEL) light-emitting semiconductor junctions connected in series with one another and configured to emit light along a common axis so as to direct a single beam onto the imaging surface.

In order to provide improved heat management, in an embodiment of the invention, the integrated electronic modules are arranged in two rows that are spaced from one another in the X-direction, the system further comprising two or more separate packages containing electronic driver circuitry to provide electrical power to the integrated electronic modules, wherein integrated electronic modules that are spaced from one another in the X-direction are connected to be powered by different ones of the packages. Advantageously, such arrangement also provides relatively more space for the electrical connectors leading to the individual VCSEL elements.

The electronic driver circuitry may suitably be electrically connected to the integrated electronic modules by conductors on a flexible circuit board. Furthermore, the integrated electronic modules and said electronic packages of said electronic circuitry may be thermally coupled to a common heatsink.

The selectively irradiated polymer (or particles thereof) transferred, in one embodiment, from an imaging surface to a printing substrate (e.g., as thin film dots) can be referred to as the printing material. While in most printing systems, the polymer in itself provides the desired printing effect (e.g., a visual effect, the polymer optionally including a coloring agent), the polymer can alternatively constitute only part of the printing effect. For instance, the polymer transferred to the printing substrate may serve as an adhesive to a distinct printing material (e.g., embellishment particles made of solid polymeric materials—for instance, thermoplastic or thermoset plastic polymers—or made of non-polymeric materials, such as metals, alloys, glasses or ceramics). The embellishment particles, serving as printing material subsequently applied in such embodiments (e.g., being deposited at an embellishment station on the adhesive formed by the polymer rendered tacky), can have any desired shape. By way of non-limiting examples, the embellishment particles may have a globular shape, a rod-like shape, a flake-like shape or any irregular shape that may suitably adhere to the tacky adhesive layer formed by the radiated polymer. Such printing material can be readily selected according to the desired printing effect, and for instance metallic flakes can be appropriate if the desired effect involves a metal appearance.

It is noted that according to some further additional printing processes, selective formation of printing material on the substrate may be effected by the imaging module directly targeting the substrate, rather than an intermediate transfer member coated with a transferable polymer. For instance, selective radiation may be employed according to the principles described above to modify (e.g., to "activate") selective regions on an imaging surface residing on the substrate, so that the printing material (e.g., embellishment particles) may be glued onto the substrate in the modified regions able to serve as adhesive. The use of polymer selectively exposed to radiation on either type of imaging surface for the transfer and/or formation of an adhesive layer for a subsequently applied printing material is described in more details in co-pending application GB 1809302.1 to the same Applicant, filed on Jun. 6, 2018.

While adhesives activatable on the substrate may share similar physical and/or chemical properties with the polymers transferable from an intermediate member, they need not necessarily be the same. For instance, while transferable polymers or particles thereof are generally thermoplastic polymers, the activatable adhesives can additionally be alternatively made of thermoset polymers, as long as their glass transition temperature (Tg) is above ambient temperature (e.g., having a Tg of 25° C. or more, 35° C. or more, or 45° C. or more). Thus, in view of the various embodiments in which an imaging module according to the present teachings can serve to produce a desired printing effect, the term "polymer" or "polymer particles" refer to any material or materials that are intended to be selectively modified by the radiation as described above for allowing selective formation on the substrate of a printing material during the printing process, including by transfer of the radiated polymer thereto. A suitable polymer, which can be selectively modified by radiation using an imaging device according to the present teachings, can either absorb the radiation by itself (e.g., using a radiation absorbing polymer and/or or a polymer containing inter alia a radiation absorbing agent), or be softened by radiation absorbed by its underlying support (e.g., the imaging surface being an intermediate transfer member or a printing substrate) or by a combination of both.

The polymer particles can either be formed wholly of a polymer or can be particles that only have a polymer coating. When the polymer particles by themselves provide the printing effect, the particles typically including coloring agents such as dyes or pigments, the polymer can be viewed as a printing ink or said to serve as an ink. This does not rule out the presence of coloring agents in polymer particles serving alternative purposes, such as for overcoatings (e.g., as applied to afford protection of printed matter) or even for adhesives.

While the invention is illustrated in the present description for a visually detectable printing effect (e.g., the printing material forming visual content of text and/or images typically under visible light), this should not be construed as limiting. The desired printing effects can alternatively and additionally include a tactile effect (detectable by touch feel of the printing material), an olfactory effect (e.g., the printing material or the printing ink including a scent) or any other functional effect (e.g., using anti-counterfeiting inks, luminescent inks, electrically conductive inks, and any such functional inks readily appreciated by the skilled person).

According to another aspect of the present invention, there is provided a printing method as hereinafter set forth in claim 16 of the appended claims.

BRIEF DESCRIPTION OF THE DRAWINGS

Some embodiments of the disclosure will now be described further, by way of example, with reference to the accompanying figures. The description, together with the figures, makes apparent to a person having ordinary skill in the art how some embodiments of the disclosure may be practiced. The figures are for the purpose of illustrative discussion and no attempt is made to show structural details of an embodiment in more detail than is necessary for a fundamental understanding of the disclosure. For the sake of clarity and convenience of presentation, some objects depicted in the figures are not necessarily shown to scale. In the Figures:

FIG. 5A illustrates spot profiles of the power of seven light spots arranged along the Y axis, and a combined profile representing the light sources' total power distribution, compared to a threshold value h;

FIG. 5B illustrates individual spot profiles and a combined profile of the power of seven light spots as in the example of FIG. 5A, wherein one of the light sources is inoperative;

DETAILED DESCRIPTION

There is described below a printing system comprising a movable member configured for carrying on an imaging surface thereof a polymer (e.g., capable of forming a printing ink, an overcoat or an adhesive), while displacing at a velocity v along an X-direction of an X-Y plane. The printing system further comprises a writing module configured for producing a multitude of light spots arranged in an ordered pattern on the X-Y plane, the writing module capable of outputting a multitude of parallel light beams (e.g., spaced from one another in the Y-direction). The writing module comprises individually controllable light sources disposed in groups on several integrated electronic modules and arranged in an ordered pattern corresponding to the pattern of the light spots. Each light source comprises at least two light-emitting semiconductor junctions electrically connected in series and arranged in one or more VCSELs. The VCSELs of each light source are spatially arranged and optically configured to produce, when activated, a single light spot on the X-Y plane. The writing module further comprises electronic circuitry deployed on two or more electronic chips, the circuitry being electrically associated with the light sources and configured to individually activate and deactivate the light sources.

The writing modules and inter alia their associated electronic modules, circuitries and assembly form a station of the printing system which can be referred to as a writing station, which may optionally further include an optical system. The printing system may further comprise at least one of the following: (a) a coating station, where polymer can be applied to the imaging surface, optionally in the form of polymer particles, and further optionally in the form of a monolayer; (b) a transfer station or impression station, where radiated polymer can be transferred from the imaging surface to a printing substrate; (c) an embellishment station, where embellishing particles can be applied to radiated polymer; (d) a conveyer for delivering the printing substrate at least to the writing station; and (e) a finishing station, where the printing substrate carrying inter alia the radiated polymer is further processed (as conventional in the printing industry).

The principles, uses and implementations of the teachings herein may be better understood with reference to the accompanying description and figures. Upon perusal of the description and figures present herein, one skilled in the art is able to implement the disclosure without undue effort or experimentation.

An Exemplary Printing System

Figure 1A:
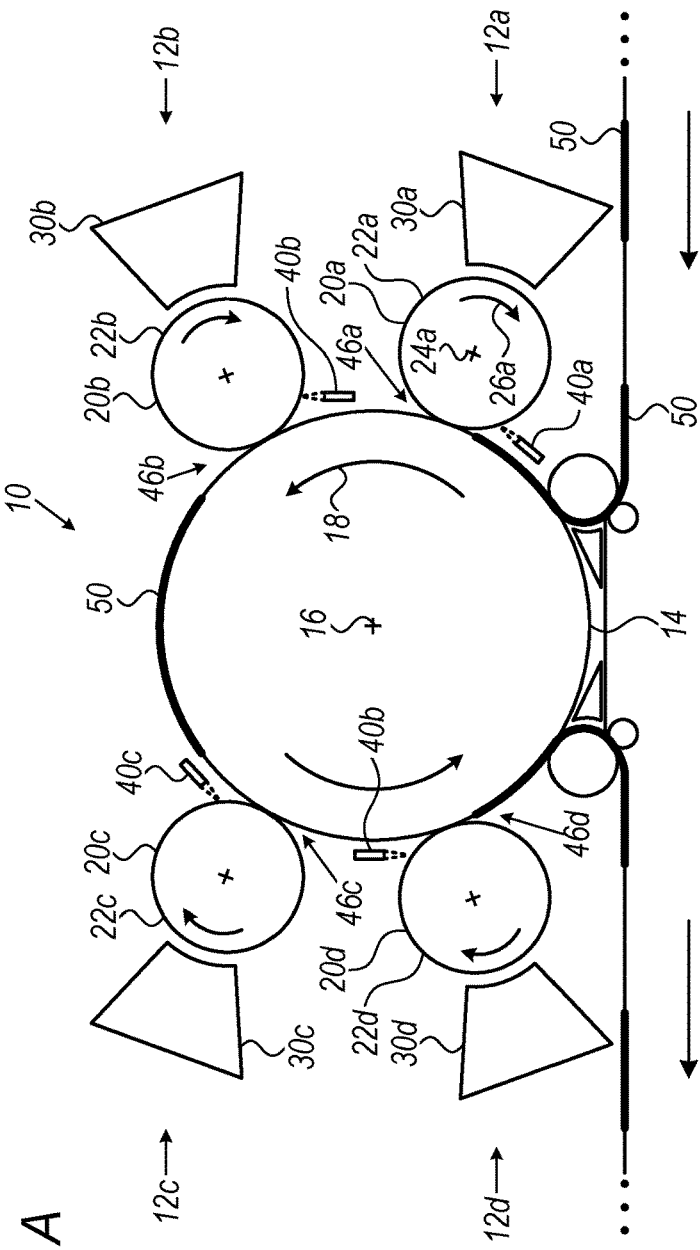
FIG. 1A schematically depicts an embodiment of a printing system according to the teachings herein.

FIG. 1A schematically depicts an embodiment of a printing system 10 according to the teachings herein. Printing system 10 is configured to print on a substrate, e.g., sheets of paper, with up to four layers which may represent inks of different printing colors such as cyan, magenta, yellow and black (CMYK) inks, or coating materials such as lacquers. Printing system 10 comprises four transfer or impression stations 12, denoted specifically 12a, 12b, 12c and 12d, each impression station being configured to print one of the up to four layers. Impression stations 12 are arranged around an impression cylinder 14, configured to revolve around a cylinder axis 16 according to the direction denoted by arrow 18. The impression stations 12a, 12b, 12c and 12d and the elements associated therewith are substantially identical to one another. Consequently, in the explanation hereinbelow the extensions "a", "b", "c" or "d" are generally omitted from the respective numerals of impression stations 12 and the associated elements, when the description pertains to an element in any or all the impression stations. When the description relates explicitly to a specific impression station or to a specific associated element (e.g., relating specifically to impression station 12b, rather than relating generally to impression stations 12), then the specific extension is included. It should be understood that the number of four impression stations and hence four colors is entirely arbitrary and provided only for illustrative purpose, whereas the printing system may incorporate any number of one or more impression stations 12, being capable of printing correspondingly one or more layers (e.g., colors).

Each impression station 12 includes a movable transfer member 20 having an imaging surface 22 on an external surface thereof. Transfer member 20 is formed as a drum, being configured to revolve around a drum axis 24 along the direction denoted by arrow 26 (only axis 24a and arrow 26a are explicitly indicated in the figure). Each impression station 12 is further associated with a coating system 30, configured to coat the transfer member 20 on the imaging surface 22 with thermoplastic polymer particles that may serve as an overcoat to printed matter (e.g., a lacquer), as an adhesive (for example to enable a metallization coating to be subsequently adhered to a substrate upon which it would transfer) or as a printing material in itself (e.g., the polymer further including a coloring agent, also referred to as a pigmented polymer serving as an ink). The polymeric material coating the transfer member may be selectively transferred to the substrate only after being modified by radiation as explained and detailed below. According to some embodiments, the coating on the imaging surface is uniform, namely the imaging surface 22 is coated by the coating system 30 with a uniform layer of polymer. According to some embodiments, the polymer may be a substantially uniform particle layer, for example consisting of a monolayer of nanometric or microscopic particles (e.g., of size between about 100 nm and 10 μm) covering the imaging surface. By substantially uniform it is meant that the layer is uniform on a macroscopic scale that may be in the range between the size of a sheet of substrate (or the printing format width), and the dimension of a pixel of the printing system 10, but may not be uniform on a microscopic scale smaller than a pixel size (but larger than atomic scale). According to some embodiments, the polymer is solid and it can be modified by irradiation, e.g., to be tacky or to be jelly or to be liquid, thereby rendering the modified material suitable for transfer to the substrate. Suitable polymers comprise thermoplastic polymers and may further include a desired coloring agent.

While polymers in tacky state are generally preferred, as dots formed therefrom typically remains above the surface of the printing substrate, polymers rendered more liquid by exposure to the radiation may also be suitable. The terms "tacky" and "sufficiently tacky" as used herein are not intended to mean that the irradiated spots of polymer on the imaging surface are necessarily tacky to the touch but only that the polymer in these selected regions is softened sufficiently to enable its adhesion to the surface of a substrate when pressed against it in the transfer station or to enable the adhesion of embellishment particles to its surface at an embellishment station.

Each impression station 12 further includes a writing module 40, configured to controllably and selectively radiate energy onto selected regions of the imaging surface 22 of the transfer member 20, thereby modifying the polymer on the radiated, selected regions, to permit transfer to the substrate.

During operation, the coating system coats the imaging surface of the transfer member which moves (continuously or quasi-continuously, as in continuous back-and-forth motion, or intermittently) relative to the coating system.

A coated portion of the imaging surface is displaced due to the transfer member's movement—e.g., the drum's continuous rotation—into a position aligned with the writing module, wherein a selected region of the coated portion of the imaging surface, selectively and synchronously with the displacement of the imaging surface, is radiated by the writing module to soften the polymer thereon (e.g., rendering it sufficiently tacky to transfer to a substrate). It should be noted that the modification of the polymer need not necessarily be direct and may be indirect. For example, the radiated energy may, in some embodiments, be absorbed by the polymer, thereby modifying the polymer directly. In other embodiments, the radiation may be mostly absorbed by the imaging surface on which the polymer is disposed, or by underneath layers of the transfer member, the heat thereafter propagating towards the imaging surface, whereupon the polymer is then heated "indirectly". Whether the polymer is modified by the radiation "directly" or "indirectly" may have considerable consequence on the energy conversion efficiency (indirect modification typically involving lower efficiency). Thus, when indirect heating is involved, the radiation may be absorbed in part or completely by a thin layer of the transfer member adjacent to the imaging surface, thereby heating the imaging surface—and the polymer thereon—in well-defined regions. The low or even vanishing thickness of the thin layer of the transfer member in which the radiation may be absorbed ensures that the borders of the radiated regions on the imaging surface may not be unduly modified due to heat diffusion along the transfer member.

Following radiation, the portion of the transfer member subjected to the selective activation of the writing module further moves so that the radiated region reaches a nip 46 of the impression station 12. It should be understood that FIG. 1A (as well as FIGS. 1B and 1C described below) depicts schematically a side view of printing system 10, hence the nip 46 is the line of contact between the transfer member and the impression cylinder, extending generally in parallel to the cylinder axis of rotation 16. For simplifying the explanation hereinbelow, a local (Cartesian) coordinate system is defined so that the X-Y plane is tangential to the imaging surface, wherein the X axis (or X direction) coincides with the local direction of motion of the transfer member, the Y axis (or Y direction) is parallel to the nip 46, and the Z axis is directed perpendicular to the imaging surface. It should be noted that while the embodiment illustrated in the figure relates to a printing system in which the substrate is in movement with respect to the writing modules and their respective impression stations, which can be seen as "print heads" of traditional printing systems, any other arrangement causing a relative motion between the "print head" able to form an image and the substrate upon which the image can be formed is equally feasible. For instance, the impression station can be capable of moving over a platform stationary in the X and Y coordinates upon which the substrate can be positioned. The cylinder of the impression station can have the width or length of the substrate to be printed upon, its movement with respect to the platform allowing to from the desired print out in one pass. Alternatively, the cylinder of the impression station can be shorter/narrower than the area of the substrate to be printed, in which case the impression station can be moved in swath in the X and Y directions so as to cover the entire printable area of the substrate in multiple passes.

The length of the line of contact represented by nip 46 is related to the printing format namely the width of the substrate—which may be a continuous web or in the form of separate sheets. The printing format in printing system 10 may be adapted to the width of the substrate to be printed in the machine and can be in the range between a few centimeters and a few meters. In other words, printing system 10 may be configured to print substrates at a maximum size of a few cm such as business cards or envelops; or a few tens of cm, for example be about 20 cm as the width of standard A4 or Letter pages; or be about 1 meter, being configured to print on A0 (or B0 or C0) size substrates; or even be as a large as a few meters, e.g., about 5 meters, thereby being suitable for large format printing e.g., street posters or large-size packages.

Synchronously with the displacement of the transfer member, a substrate 50 may be fed into printing system 10, and carried onto impression cylinder 14. Substrate 50 may be made of a suitable material such as paper, cardboard, plastic, fabric etc. The substrate may be fed to printing system 10 in a continuous form in some embodiments, and in some embodiments in a form of discrete sheets. The substrate may be carried on impression cylinder 14 to nip 46, where the transfer member and the substrate are pressed to one another, thereby effecting the transfer of polymer in the radiated regions from the imaging surface to the substrate. Following the transfer of polymer from such selected regions on the imaging surface to the substrate, the selected regions on the imaging surface are devoid of polymer particles. The continued motion of transfer member 20 (e.g., the continued rotation of the drum) carries the imaging surface including the depleted regions again below the coating system 30, where these regions are replenished with polymer particles to form again a uniform or a substantially uniform layer on the transfer member.

The feeding of the substrate 50 towards nip 46 is synchronous with the displacement of the imaging surface 22 in that the substrate and the transfer member 20 move together, namely there is no relative displacement between the substrate and the transfer member at the nip. The feeding of the substrate towards nip 46 and the displacement of the imaging surface are synchronous also in that a location of the substrate on the impression cylinder and a location of a specific radiated, modified region on the imaging surface are aligned so that the polymer on the radiated region is transferred to an accurately pre-defined region on the substrate. Thus, the displacements of transfer members 12a, 12b, 12c and 12d are all synchronous with the advancement of the substrate from one impression station to a next impression station—being typically linked with the rotation of impression cylinder 14—and hence are all mutually synchronous with one another. Consequently, the printing on the substrate in impression station 12d is accurately aligned with the printing on the substrate in impression stations 12c and 12b and in impression station 12a, thereby enabling co-aligned printing of pixels of, e.g., 4 colors such as CMYK or any other basic color combination, to create a desired hue on the substrate.

Figure 1C:
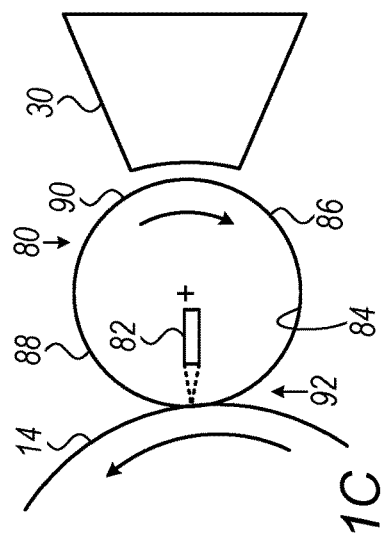
FIG. 1C schematically depicts a further embodiment of a printing system.
Figure 1B:
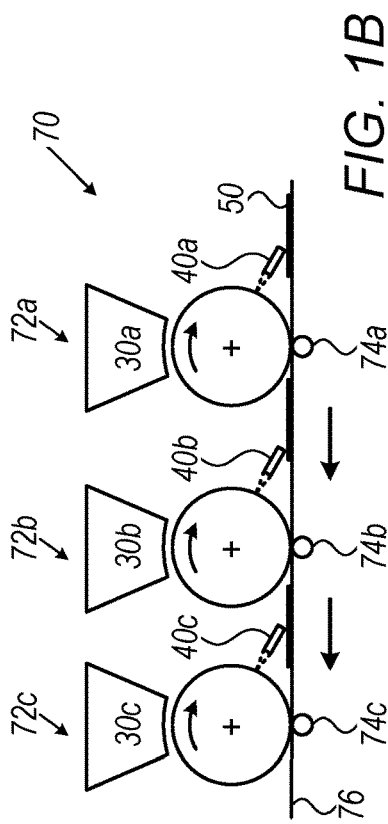
FIG. 1B schematically depicts a printing system having a different architecture from that of FIG. 1A.

FIG. 1B depicts schematically an alternative embodiment of a printing system 70. Printing system 70 differs from printing system 10 in that printing system 70 lacks a single impression cylinder around which the impression stations are arranged and around which the substrate is carried. Instead, printing system 70 comprises a number of impression cylinders 74a, 74b and 74c in correspondence with the number of impression stations 72a, 72b and 72c arranged along a substrate carrier 76. In the embodiment illustrated in the figure, where the substrate carrier is planar in the segment in which the impression stations and respective impression cylinders are positioned, printing system 70 may be suitable for printing on rigid or semi-rigid planar substrates.

A different printing process may be employed by a variation of the embodiment of printing system 70, wherein, for example, the writing modules 40 are directed towards the substrate carrier 76 to modify the substrate 50 itself or some material coating the top surface of the substrate. For example, the substrate may be coated by glue which may be selectively activated (e.g., heated up to become sticky in selective regions) by the radiation of the writing modules 40. Hence, when the substrate is pressed to the transfer member at the nip, the printing material may be transferred from the transfer member only to the selectively-radiated regions on the substrate. As in previous alternatives, the polymer serving as adhesive in the present embodiment, can be either capable of directly absorbing the radiation, or be indirectly softened by heat transferred from a radiation absorbing printing substrate underneath, or be rendered sufficiently tacky to attach a subsequently applied printing material by a combination of both mechanisms.

FIG. 1C depicts schematically a further embodiment of a printing system 80. Printing system 80 differs from printing system 10 in that a writing module 82 is positioned, aligned and configured to radiate a back surface 84 of a transfer member 86, the back surface 84 being opposite to an imaging surface 88 coated with the polymer. In the example depicted in FIG. 1C, the writing module is positioned inside a drum 90, radiating onto an inner surface of the drum, whereas the polymer is disposed on the imaging surface on the outer surface of the drum. According to some embodiments, the transfer member 86 or portions thereof and/or the drum 90 or portions thereof, are transparent to the radiation of the writing module 82. Thus, the radiation may more effectively reach the polymer or be absorbed in the transfer member near the imaging surface on which the polymer is disposed, to indirectly affect the polymer and modify the same substantially at the nip where the polymer transfers to the substrate. For example, the transfer member may be transparent throughout its entire cross-section or at least throughout most of its cross section to such radiation, enabling radiation from the writing module to be absorbed by the polymer to heat up the polymer (e.g., rendering it suitably tacky for transfer). According to some embodiments, the drum and transfer member may be configured so that the radiation may be absorbed in part or completely by a thin layer of the transfer member adjacent to the imaging surface, thereby minimizing or preventing heat diffusion along the transfer member while heating the polymer, as described above. Thus, in printing system 80 the polymer may be modified by the radiation—e.g., may be softened or liquified—at a nip 92 or very close to the nip 92 between the impression cylinder 14 and the transfer member 86. Exemplary printing systems wherein imaging devices and writing modules according to the present teachings can serve to selectively radiate the back surface of a transfer member coated with polymer on the imaging surface are further detailed in WO 2018/100412 and WO 2018/100528, all foregoing applications to the same Applicant having published on 7 Jun. 2018.

In the printing process described herein it is desirable for the irradiation of the polymer by the writing module to be done along a region at a well-defined distance from the nip. Such well-defined distance may be zero or very close to zero as is exemplified in printing system 80, or may be substantially different from zero, as is exemplified in printing systems 10 and 70. In other words, it is desirable in some embodiments that the radiation be performed across the transfer member along a region which generally extends parallel to the nip and is as narrow as possible. A well-defined distance between the irradiation region on the transfer member and the nip means a well-defined time gap between the imaging step and the impression step, because the steps of coating, imaging and impression are advantageously performed while the transfer member moves. Conversely, a wide region over which the transfer member is irradiated, namely distributed distances (across the transfer member) between the irradiation locations and the nip, implies a wide range of time gaps between the irradiation event and the impression event. In some embodiments, the modification of the polymer is temporary and time dependent—for example when irradiation softens or liquefies the polymer by heat—and therefore a wide distribution of time gaps between irradiation and impression might cause irregular print quality. It is therefore concluded that irradiation of the transfer member is advantageously performed along a region across the transfer member which is as narrow as possible, generally implying that the light sources should preferably be assembled along an elongated region in one direction parallel to the nip (in the Y-direction) and be as tightly packed as possible along a perpendicular direction (along the motion of the transfer member in the X-direction).

Writing Module

The writing module comprises a multitude of individually controllable light sources arranged in an ordered pattern and configured to produce parallel light beams. In some embodiments (generally, wherein the light beams are characterized by relatively large divergence angles) the writing module may further comprise an optical system, generally comprising a multitude of lenses, configured to focus the light beams so as to image the light sources (or focus the light beams) onto the imaging surface of the transfer member of the printing system.

Figure 2A:
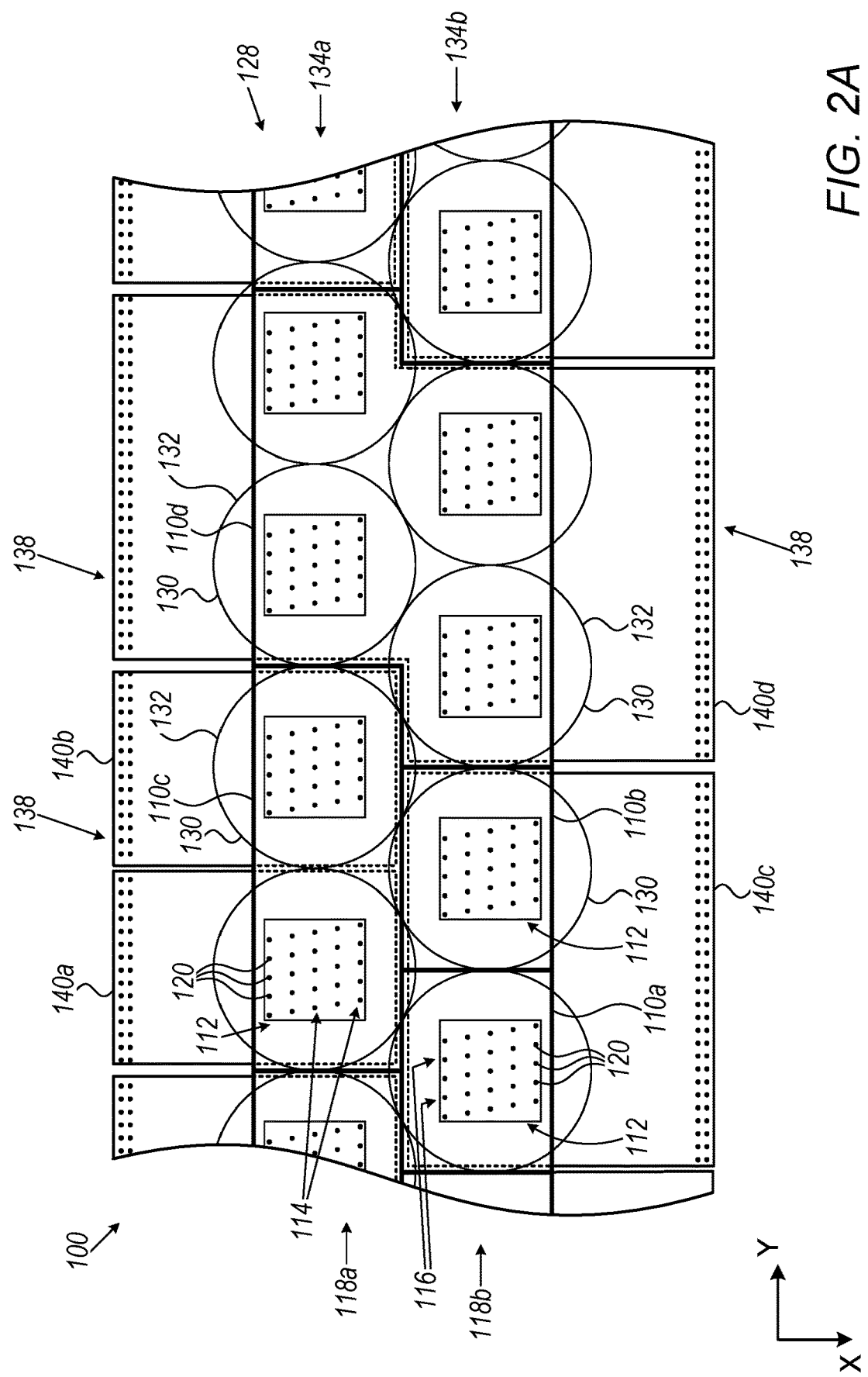
FIG. 2A schematically depicts a bottom view of an exemplary embodiment of a writing module comprising several integrated electronic modules, each constructed as an electronic die comprising an array of light sources.

FIG. 2A schematically depicts side of a writing module 100 that faces the imaging surface. Writing module 100 may exemplify some embodiments of writing modules 40 and 82 depicted in FIGS. 1A-1C. Writing module 100 comprises several integrated electronic modules 110 (designated specifically 110a, 110b etc.), each constructed as an electronic die or chip and comprising an array 112 of light sources 120. Integrated electronic modules 110 are mounted, directly or indirectly, on a heatsink or a cooler (not depicted in this figure), configured to remove excess heat from the integrated electronic modules 110 during operation, as is explained in detail further below. The surface of integrated electronic modules 110 that faces the heatsink is termed herein the rear surface (or rear side) of the module, whereas the other surface (which is viewed in the figure) is identified herein as the front side or the light-emitting side.

Integrated electronic modules 110 are VCSEL dies, as detailed further below. Each array 112 comprises rows 114 and columns 116, and is arranged to be skewed so that the rows 114 are parallel to the Y direction and the columns 116 are tilted at an angle θ relative to the X direction. The angle θ is determined so that the locations of the light sources 120 along the Y direction are equally spaced, namely the projection on the Y axis of the locations of the light sources 120 in each array form an equally spaced grid. In the embodiment of FIG. 2A, arrays 112 are similar to one another, each having an equal number, five, of rows and columns. It should be understood that other embodiments are contemplated, including embodiments having arrays with rows perpendicular to the columns and both rows and columns are tilted at an angle to the X-Y axes; or embodiments having non-identical arrays, or arrays with a number of rows and columns different from five, or arrays with a number of rows different from the number of columns. It is further noted that integrated electronic modules 110 may comprise additional light sources (not depicted here) to the light sources in the arrays 112. Such additional light sources may be employed as redundancy, or spare, to bridge gaps in the grid of light spots along the Y direction due to, e.g., failed light sources within the array, or due to e.g., minor dislocations (e.g., resulting from misplacement) of one integrated electronic module 110 relative to another during assembly.

The arrays 112 are arranged in the illustrative figure along two lines 118a and 118b, the lines extending parallel to the Y direction, and being spaced apart from one another along the X direction. The arrays are arranged along the lines 118a and 118b in a staggered arrangement so that neighboring arrays along the Y direction are positioned on different lines alternatingly. In other words, the arrays neighboring (along the Y direction) an array on line 118a are located on line 118b, and conversely, arrays neighboring an array on line 118b are on line 118a.

Writing module 100 further comprises an optical system 128 configured to focus the light beams of light sources 120 onto an imaging surface (e.g., imaging surface 22 or 88 as respectively exemplified in FIGS. 1A and 1C—the imaging surface is not depicted in FIG. 2A). According to some embodiments, optical system 128 is configured to image light sources 120 onto imaging surface 22. According to some embodiments, optical system 128 comprises lenses 130 each lens 130 being associated with one array 112 of light sources. An optical system comprising micro-lenses wherein each lens is associated with one light source, and preferably manufactured together with the light source, is also contemplated. Additionally, or alternatively, according to some embodiments an optical system may comprise optics (e.g., lenses), so that a single lens may image a group of VCSEL dies onto the imaging surface, and the adjacent lenses are lined up in the Y direction.

According to some embodiments, the lenses 130 comprise Gradient Index (GRIN) lenses. GRIN lenses are preferred compared to spherical lenses, because GRIN lenses, which are constructed as elongated rods 132 extending along the Z axis, may be self-aligned during assembly as is described herein below. In the figure, a bottom view of the rods 132 is presented. According to some embodiments rods 132 are of identical diameter and are arranged (in the X-Y plane) in a close-packed arrangement in two rods lines 134a and 134b, corresponding to lines 118a and 118b, respectively. In such an arrangement, the rods 132 are self-aligned (in the Z direction) parallel to one another, hence the light beams focused by different rods are also aligned substantially parallel to one another.

It is noted that arrays 112 are spaced apart along the lines 118a and 118b, in 1-to-1 correspondence to the positions of rods 132 along the rods lines 134a and 134b, respectively. In other words, the arrays are located so that the light beams produced by each array may be focused by one GRIN rod 132 (onto imaging surface 22). If arrays 112 are identical to one another, then the distance between corresponding points of neighboring arrays along any of the lines (118a or 118b) is equal to the diameter of rods 132.

The magnification of optical system 128 may be +1 or −1 or any other number, preferably having an absolute value smaller than 2, still preferably being relatively close to 1. If the magnification is +1 or −1, then the light beams of each array generate an array of spots on imaging surface 22, substantially identical with the array 112. Thus, when the magnification of optical system 128 is +1 or −1, the arrays 112 are spaced apart along the lines 118a and 118b, so that the locations along the Y direction of the light sources of two neighboring arrays are equally spaced. In other words, the distance, along the Y direction, of e.g., a left-most light source on an array on line 118a and a right-most light source on a neighboring array on line 118b, is equal to the distance between two locations along the Y direction of neighboring light sources in a same array.

According to some embodiments, the absolute value of the magnification of optical system 128 may be different from 1, namely either higher or lower than 1, and consequently an imaged array of light spots on the imaging surface is larger or smaller than the corresponding array 112, respectively. Thus, for example, if the magnification is larger than 1, then each array's image is magnified through optical system 128, hence to obtain on the imaging surface an equally-spaced grid of light spots along the Y direction, neighboring arrays should have a gap between their closest light sources, which is larger than the gap along the Y direction between neighboring light sources on a same array. It will be appreciated by the person skilled in the art that the spacing along the Y direction of light sources on a specific die in such a case need be smaller than the intended spacing between the imaged light spots (which relates to the address resolution of the printing system). And vice versa—if the absolute value of the magnification is smaller than 1, then each array's image is shrunk through optical system 128, hence to obtain an equally-spaced grid of light spots along the Y direction, neighboring arrays should partially overlap along the Y direction.

It is yet further noted that a magnification of +1 by the optical system 128 (and positive magnification in general), is preferred in some embodiments. If the magnification is positive, a dislocation of a lens relative to the related array may be compensated, at least partially, by the lens, in that the dislocation of the resulting light spots on imaging surface 22 is diminished. In comparison, in a case of a negative magnification, such a misalignment of a lens may be magnified so that the dislocation of the resulting light spots on imaging surface 22 is enhanced.

Embodiments of writing module 100 may comprise integrated electronic modules 110 in various shapes and sizes as is demonstrated in FIG. 2A. For example, integrated electronic modules 110a and 110b each include a single array 112. Integrated electronic module 110c is arranged as a rectangle including two arrays 112. Other embodiments may include rectangle integrated electronic modules 110 having more than two arrays arranged in a line. Integrated electronic module 110d comprises four arrays 112, two of which are arranged on line 118a and two on line 118b. It is noted that including on a single die of integrated electronic modules 110 arrays from both lines 118a and 118b may necessitate that the border line of the die is not rectangular nor is it quadrilateral, which implies more complicated cutting technique (compared to a rectangular-shaped die).

Various and even conflicting considerations apply to the selection of the size and shape of integrated electronic modules 110. A relatively large integrated electronic module 110, including several arrays 112, contributes to decreasing mismatch between locations of neighboring arrays 112 in a single writing module 100 during assembly, and hence contributes to eventual higher writing quality in the printing system. Further, such a relatively large integrated electronic module 110 allows for a more compact configuration of the arrays, by minimizing dead space which is generally associated with the edge of the die. On the other hand, large integrated electronic modules 110 tend to be very brittle. Current manufacturing and operational constraints typically limit the thickness of integrated electronic modules 110 to no more than a few hundreds of micrometers and possibly even 100 μm or less, because large thickness might detrimentally affect the efficiency of excess heat removal from the module, or light beam quality, or both. Thus, in a preferred configuration an integrated electronic module 110 may include one or two or even more arrays 112, but the overall dimensions thereof may preferably be limited to less than a few centimeters and according to some embodiments even less than one centimeter.

Nonetheless, it is noted that another limitation on overall size of integrated electronic module 110 emerges from the manufacturing technique. Semiconductor lasers are typically manufactured on wafers, thereby limiting the maximum theoretical size of an integrated electronic module to the wafer diameter, and practically to no more than half the wafer diameter, being typically smaller than 20 cm and even smaller than 10 cm. Also, large integrated electronic modules 110 may result in reduced yield of manufacturing, as a single die that includes several arrays includes more light sources, thus increasing the likelihood of a failed light source on a specific die. Because the typical printing format in printing system 10 may be larger than about 10 cm or even 20 cm, and in some embodiments printing format may typically be larger than 1 meter, it is concluded that writing module 100 may typically comprise several integrated electronic modules 110, and possibly tens or even hundreds of integrated electronic modules 110 assembled side by side.

Various and even conflicting considerations may apply also to the mounting technique of integrated electronic modules 110. According to some embodiments, integrated electronic modules 110 may comprise electric contacts on the front (light-emitting) surface thereof, thereby enabling feeding electric signals to the light sources via the front side and thereby enabling mounting the integrated electronic modules 110 directly on an electrically isolating surface of the heatsink, thus enabling efficient heat removal from the module during operation. The heatsink can be passive or active, depending on the amount of heat one needs to remove under particular operating conditions. It is noted that electric contacts of the integrated circuit on the front side may be positioned according to common manufacturing techniques on the periphery of the die, thus necessitating a net of conductors on the die that electrically and exclusively connect each light source with at least one contact. Experience shows that due to the die brittleness, the density of contacts on the die's periphery and the density of dies arranged side by side in the writing module, wiring the integrated electronic module 110 according to this embodiment may be less preferred. According to some embodiments, integrated electronic module 110 may be mounted on a sub-mount using contacts on the back side of the die for electric connections. Such contacts—e.g., employing a Ball Grid Array (BGA) or another solder bumps technology—may each be positioned on the back side directly opposite the location of one light source, thus withdrawing the need for a net of conductors across integrated electronic module 110 itself. It is noted that the handling and assembly (mounting) of integrated electronic module 110 using a sub-mount as described herein may be a more efficient method compared to direct mounting on the heatsink as described above; however, heat removal from the integrated electronic module 110 through the sub-mount towards the heatsink may be inferior.

Writing module 100 comprises sub-mounts 140 (e.g., 140a, 140b etc.) for mounting integrated electronic modules 110 thereon as explained above. Preferably, sub-mount 140 may comprise a substrate made from a highly thermally conducting, electrically insulating material. According to some embodiments the substrate may be selected from the group comprising aluminum nitride (AlN), having thermal conductivity of 170 W/(m·° K) and thermal expansion coefficient of $4.6 \cdot 10^{-6,\circ} C.^{-1}$; beryllium oxide (BeO), having thermal conductivity of 270 W/(m·° K) and thermal expansion coefficient of 9·10$^{-6}$·° C.$^{-1}$; and CVD diamond, having thermal conductivity of 1000 W/(m·° K) and thermal expansion coefficient of 1·10$^{-6}$·° C.$^{-1}$ Various and even conflicting considerations may apply to the selection of a substrate material for the sub-mount. CVD diamond demonstrates the highest thermal conductivity, however the thermal expansion coefficient is the most distant, within the group of materials listed above, from the thermal expansion coefficient of GaAs, 5.73·10$^{-6}$·° C.$^{-1}$ (GaAs being the typical substrate in VCSEL dies). In this group aluminum nitride has the closest thermal expansion coefficient to that of GaAs, but the lowest thermal conductivity.

FIG. 2A schematically depicts several illustrative examples of sub-mounts having various sizes and shapes. Sub-mounts 140a and 140b are similar to one another, each being dimensioned and configured to be connected to single arrays 112. In FIG. 2A, integrated electronic module 110c, comprising two arrays 112, is electrically connected to sub-mounts 140a and 140b, each array being connected to one of the two sub-mounts, respectively. Sub-mount 140c is dimensioned and configured to be connected to two arrays 112, positioned side by side along one of the lines 118a or 118b. In FIG. 2A, integrated electronic module 110a and integrated electronic module 110b are both assembled onto sub-mount 140c. Sub-mount 140d is dimensioned and configured to be connected to four arrays 112, positioned as a neighboring quartet on both lines 118a and 118b. In FIG. 2A, integrated electronic module 110d (comprising four arrays 112) is assembled onto sub-mount 140d.

Sub-mounts according to the description hereinabove may be provided within a range of thicknesses, e.g., between about 100 µm and about 1 mm. There are therefore various and even conflicting considerations that may apply to the selection of size and thickness of sub-mounts 140. A relatively large sub-mount 140, allowing the assembly of several arrays 112 thereto, contributes to decreasing mismatch between locations of neighboring arrays 112 in a single writing module 100 during assembly, and hence contributes to eventual higher writing quality in the printing system. Further, such a relatively large sub-mount 140 allows for a more compact configuration of the arrays, by minimizing dead space which is generally associated with the edge of the sub-mount. However, in some embodiments heat removal may be a dominant consideration, favoring a thin sub-mount and thereby allowing for more efficient heat removal from the integrated electronic module 110 through the sub-mount towards the heatsink. Since a thin sub-mount tends to be very brittle, small sub-mounts, providing connections to only a small number of arrays 112—e.g., four arrays or two arrays or even only one array—may be preferred. Also, as a higher number of arrays are assembled onto a single (larger) sub-mount, the higher also is the likelihood of a failure (either during assembly or later during machine operation) necessitating replacement of a large fraction of the light sources in the writing module. It should be noted that, in order to minimize thermal resistance between the VCSEL arrays and the cooler underneath, one can deposit on the surface of the metallic cooler a thin layer (e.g., of a few microns, typically less than 2 µm) of electrically insulating and thermally conducting material. For instance, the surface of the cooler can be coated (e.g., by sputtering) with a thin layer of Aluminum Nitride, upon which electrical conductors are subsequently applied to individually convey the driving signals to each light emitting element.

Figure 2B:
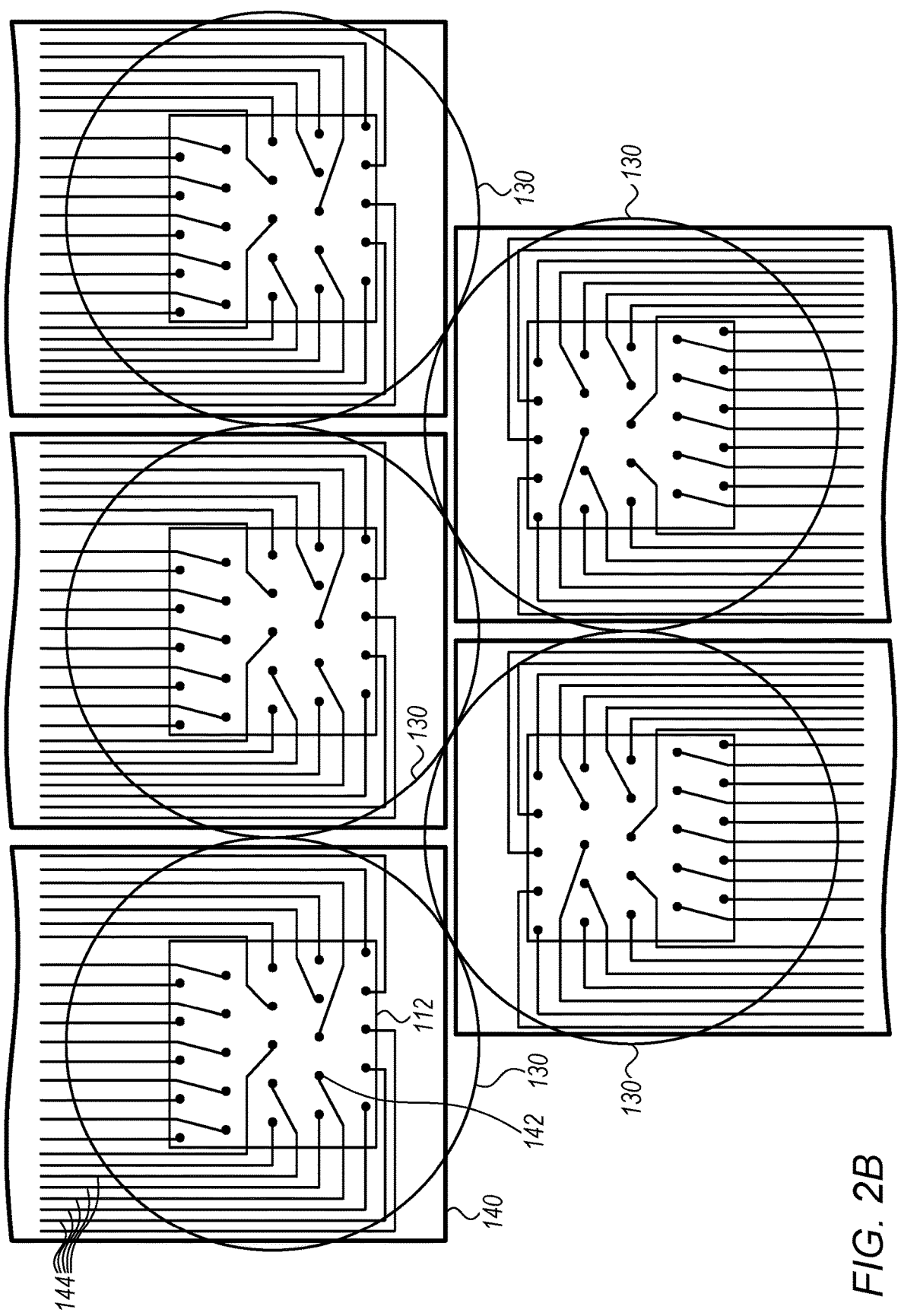
FIG. 2B schematically depicts a detailed view of a portion of a sub-mount, showing arrays of pads corresponding to the arrays of lights sources of FIG. 2A, and electrical conductors thereto.

Electrical connections to the arrays may typically be provided by metallized lines disposed on the surface of the sub-mount, typically connecting a set of contacts (e.g., arranged in a connector or array of contacts 138) and an array of pads on the sub-mount configured to solder to the solder bumps of the integrated electronic module 110 (such lines being explicitly illustrated in FIG. 2B). It is noted that the lateral density of conducting lines on the sub-mount along the Y direction corresponds at least roughly to the density of light sources along the Y direction, divided by 2. The following is a non-limiting numerical example illustrating the tight constraints associated with the current conducting lines of the sub-mount. According to the example, the lateral spacing of light sources along the Y direction is about 50 µm, hence, about 20 light sources are distributed along each 1 mm along the Y direction and about 20 conducting lines may be provided along each such 1 mm for connecting each light source. The conducting lines to arrays 112 on line 118a and to the arrays 112 on line 118b may be directed from opposite directions (namely from top and bottom of FIG. 2A), hence a total width of each line together with an adjacent spacing to a next conducting line may roughly be of about 100 µm. Assuming a spacing of about 30 µm, conducting line width of about 70 µm and metal thickness of about 10 µm, then a current of 300 mAmps generates a temperature rise of about 60° C. in the conductor (in ambient air, and independent of the conductor length). It is noted in this regard that the conducting line thickness is limited both in absolute value and in aspect ratio. The absolute thickness may be limited to several tens of µm (e.g., 10 or 20 or even 30 µm) whereas the aspect ratio of the cross section of the conducting line may be limited to 1:1 or even less (hence the thickness of a 20 µm wide line, for example, may not be larger than 20 µm, and may typically be even less). 500 mAmps of current generate in the same configuration a temperature rise of 170° C. and a power loss of about 30 mW on a 3 mm-length conductor. It should be understood that if the spacing of the light sources along the Y direction is smaller than 50 µm (possibly allowing a higher address resolution of the printing system) then the conducting line width should preferably be smaller, resulting in yet even more tight constraints on the allowed current through the conductor.

FIG. 2B schematically depicts a detailed view of a portion of sub-mount 140, showing an array of pads 142 corresponding to array 112 with 5 rows and 5 columns of lights sources (only the outline of array 112 is depicted in the figure). Each pad 142 is electrically connected to a conducting line 144. It should be noted that various and even conflicting considerations may apply to the physical dimension of array 112 and to the total number of light sources in each array. It is noted in this regard that array 112 preferably roughly forms a quadrilateral shape with four substantially equal sides. The reason is that the optical quality of the lens 130 is typically lower towards the lens' periphery, namely the imaged spot of a light source near the periphery of the array (being away from the lens center and close to the lens periphery) is typically bigger than the spot of a center light source. Hence a square array allows producing more uniform imaged light spots, compared to a rectangular array. A small array of light sources is difficult to implement for at least two reasons. First, a small number of light sources in a column implies a small distance between two neighboring light sources in a same row, and overall small dimensions of the die. For example, in an array of 2×2 wherein the distance between two adjacent projections on the Y axis of the locations of the light sources (i.e. the distance between two adjacent light spots, in case the magnification is ±1) is about 50 µm, the distance between two neighboring light sources in a row is twice as large, namely about 100 µm, which may be difficult to manufacture. The overall dimension of the die in this case may be roughly 0.3-0.4 mm, which may be, in some embodiments, more costly to manufacture due to a large number of dies, and difficult to handle and to assemble. In comparison, in an array of 5×5 with the same spacing of light sources along the Y axis, the distance between two neighboring light sources in a row can be of about 250 μm and the overall dimension (side length) of the die can be of about 1.5 mm. A second difficulty associated with small arrays is the resulting small diameter of the lenses 130. For example, in the case of a 2×2 array specified above, the lens diameter may be about 0.7 mm which may be difficult to handle and to align with neighboring light sources arrays. In comparison, in the case of a 5×5 array mentioned above, the lens diameter may be about 5 mm, lending itself for much simpler handling and alignment.

On the other hand, an array of a large number of light sources may also be difficult to implement. It is initially noted that as the array is selected to comprise a higher number of light sources, the physical dimension of the array should preferably be larger. Firstly, assuming the distance between neighboring light sources in a column remains constant, the overall dimension of the array's size is enlarged, as more light sources are included in the array. Secondly, as more light sources are included in the array, the distance between neighboring light sources in a column should preferably increase, to allow more conducting lines to extend in between neighboring light sources on the array's periphery and reach light sources in the internal portions of the array. Hence, as a general rule, array's dimensions (namely array's side length for an approximately square-shaped array) is correlated roughly with the total number of light sources in the array (and not with the square root of the total number, as could be speculated).

A large array may be difficult to implement for at least two reasons: first, a large array implies a large die that might be extremely brittle due to size. For example, a 50×50 light sources array with the same Y-axis grid spacing specified above of 50 μm, may have a side length of about 40-60 mm. As explained above regarding the integrated electronic module 110 overall dimensions, a corresponding die having a side length of about 4-6 cm might be too big to manufacture, too big to handle and too big to assemble reliably. Further, a large array necessarily implies a lower yield during manufacturing (as any single defected light source or a local defect in the wafer may disqualify the whole die). A second difficulty in implementing large arrays in writing module 100 is associated with the resulting large distribution of locations of light sources along the X axis. As explained above, a large distribution of locations of light sources along the X axis implies a large distribution of distances between the points of irradiation of the imaging surface, and the nip, resulting, in turn, in a large spread of time gaps between the event of modifying the polymer on the imaging surface by the light sources and the event of impression.

It is therefore concluded that the die of integrated electronic module 110 may be (that is, have a side length) larger than about 0.5 mm and smaller than about 25 mm, being preferably between 0.8 mm and 20 mm, still preferably between 1 mm and 10 mm and more preferably between 1 mm and 5 mm. Further, array 112 of light sources may, according to some embodiments, be larger than about 2×2 and smaller than about 50×50, being preferably between about 3×3 and about 30×30, more preferably between about 5×5 and about 20×20. It is emphasized that according to some embodiments, specifically embodiments requiring higher or lower printing resolution compared to the printing resolution discussed explicitly here, larger or smaller arrays may be contemplated.

Writing Module Assembly

Figure 3A:
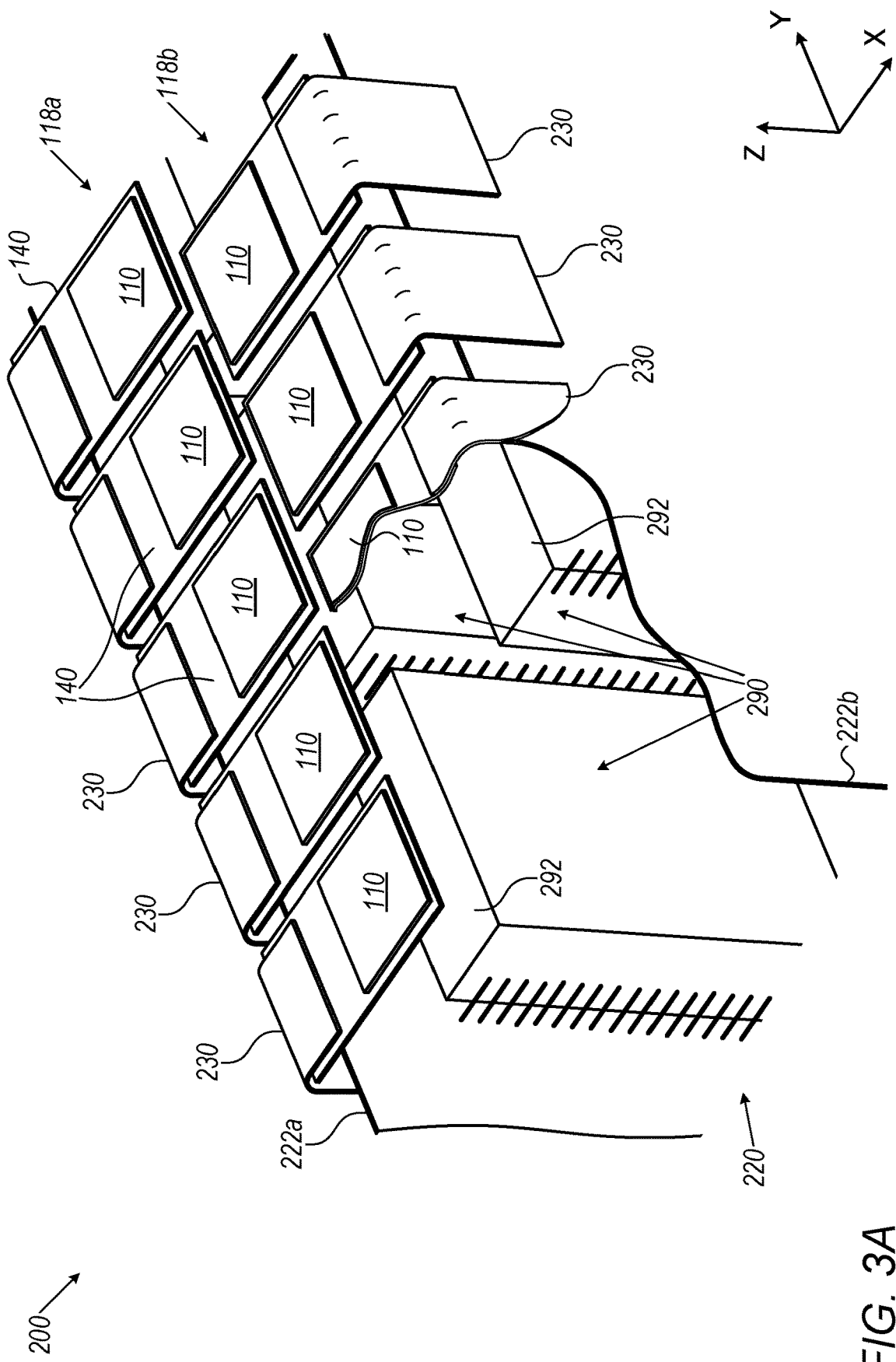
FIG. 3A depicts schematically an embodiment of a writing module in a perspective view.
Figure 3B:
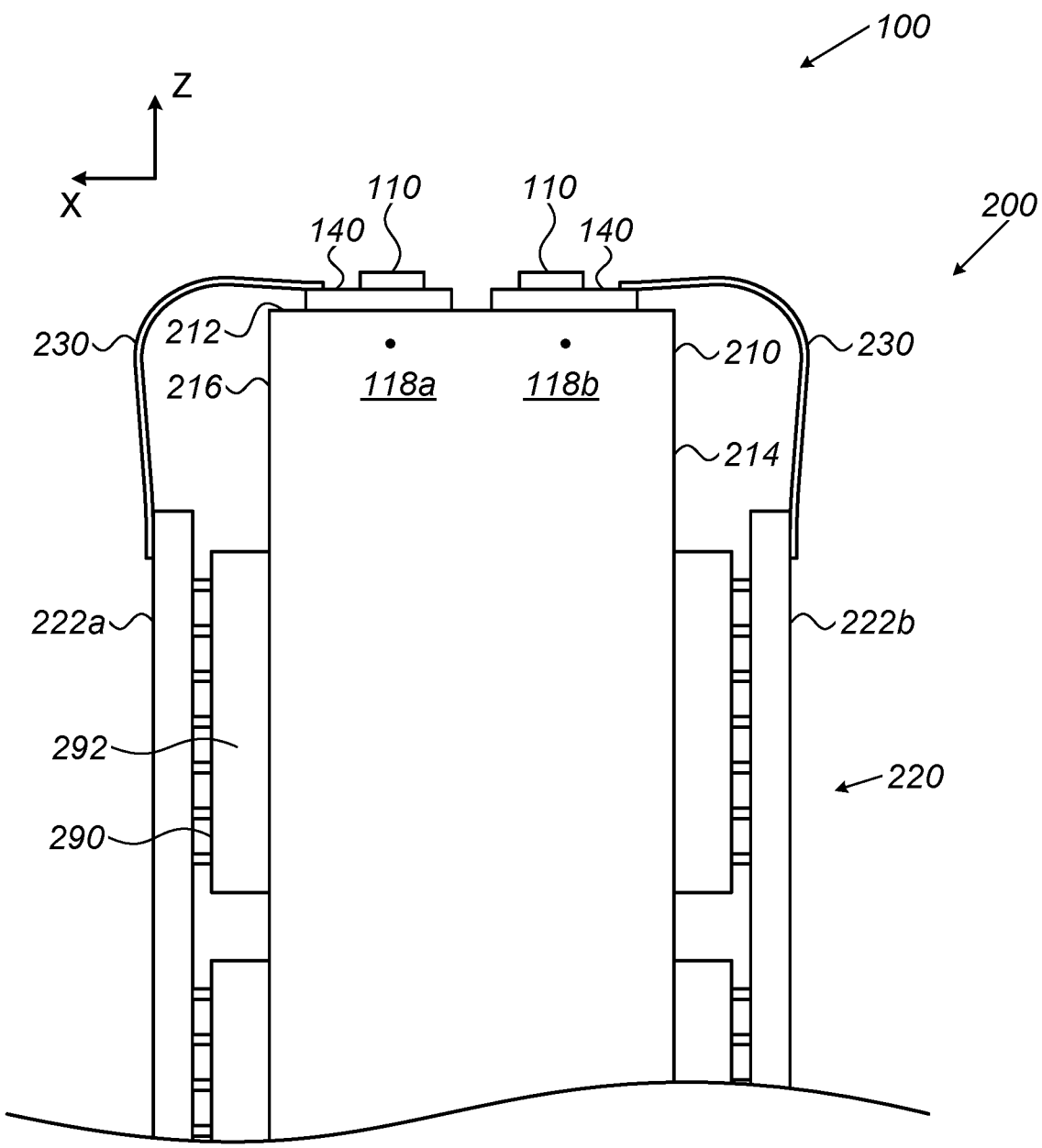
FIG. 3B depicts schematically the writing module of FIG. 3A in side view.

The writing module further comprises an electronic driver circuitry, electrically associated with the light sources and configured to individually activate and deactivate the light sources. FIGS. 3A and 3B depict schematically an embodiment of a writing module 200 as can be assembled, in perspective view and in side view, respectively. Writing module 200 can comprise writing module 100 as described above, attached by its rear side to a bottom face 212 of a heatsink 210 (depicted explicitly in FIG. 3B). For the sake of clarity, the lenses are not depicted in these Figures and the heatsink is not shown in FIG. 3A. Writing module 200 further comprises electronic circuitry 220 deployed from two sides of writing module 100. According the embodiment depicted in FIGS. 3A and 3B, electronic circuitry 220 is deployed on at least two electronic boards 222a and 222b (e.g., Printed Circuit Boards, PCB) attached to two side faces 214 and 216, respectively, of the heatsink.

The electronic circuitry of boards 222a and 222b, is connected to the integrated electronic modules 110 arranged along lines 118a and 118b, respectively, via flex circuits 230. Flex circuit 230 comprises a multitude of conducting lines, electrically isolated from one another and mechanically associated together to form a flexible, preferably flat assemblage of conductors. Flex circuit 230 is thus configured to provide a mechanically-flexible and massively-parallel electrical conduction for conducting the driving signals to the individually controlled light sources. According to some embodiments, flex circuit 230 comprises also a common conductor line, configured to commonly conduct the return current from all or at least some of the light sources in the integrated electronic module 110. The common line may have a larger cross-section than a single signal conducting line to carry the return current of at least some or all of the light sources.

A flex circuit 230 may comprise a Flexible Flat Cable (FFC) comprising a multitude of parallel flat conducting lines disposed on a thin and flexible dielectric layer or laminated between two thin and flexible dielectric layers. Alternatively, a flex circuit 230 may comprise a Flexible Printed Circuit (FPC), typically manufactured by photolithography, as is well known in the art. A typical FPC may comprise photolithographed flat metallic conductors typically made of copper or another well-conducting metal, bonded or deposited onto a thin and flexible dielectric substrate, e.g., made of polyimides or polyesters, such as Polyethylene Naphthalate (PEN) or Polyethylene Terephthalate (PET).

In some embodiments, one flex circuit 230 is associated with one sub-mount 140, however such a correspondence is not mandatory. In the writing module 200 of FIGS. 3A and 3B, sub-mount 140 has assembled thereon one integrated electronic module 110 comprising a single array 112 of light sources, and is electrically associated with a single flex circuit 230.

Figure 3C:
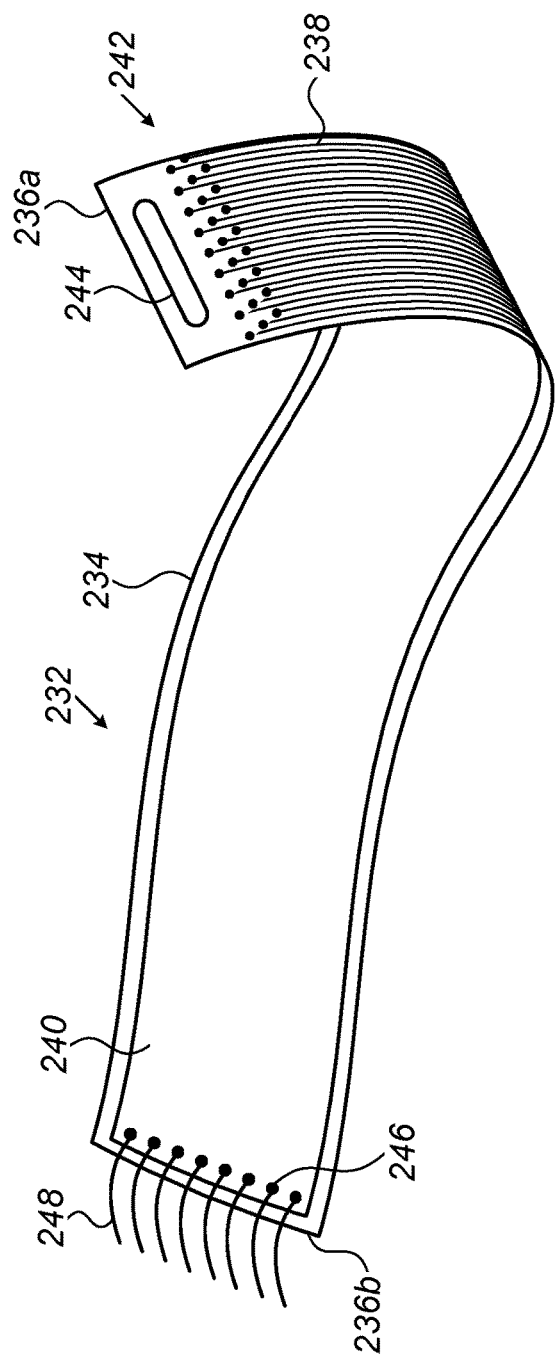
FIG. 3C schematically depicts an embodiments of a double flex circuit of the writing modules of FIGS. 3A and 3B.

FIG. 3C schematically depicts an embodiment of a double flex circuit 232, exemplifying flex circuit 230. Double flex circuit 232 comprises a double-sided FFC, comprising a dielectric layer 234 extending between a first end 236a and a second end 236b. Double flex circuit 232 further comprises multiple conducting lines 238 disposed on a first surface of the dielectric layer, being configured to conduct the driving signals to the individually controlled light sources. Multiple conducting lines 238 extend from a first array of pads 242 on the first end 236a to a second array of pads (not shown here) on the second end 236b. The first array of pads 242 is configured to connect (e.g., by soldering) to a corresponding array of pads on a PCB carrying the electronic circuitry whereas the second array of pads (not shown here) is configured to connect (e.g., by soldering) to a corresponding array of pads on the sub-mount (such as pads array 138 in FIG. 2A) or on the integrated electronic module 110. Each conducting line 238 electrically connects a single pad in the first array to a single pad in the second array.

Double flex circuit 232 further comprises a single conducting line 240 disposed on the second surface of the dielectric layer and configured to commonly conduct the return current from the light sources, thereby functioning as a common line. The common line 240 extends from first end 236a to second end 236b, and electrically connects a pad 244 on the first surface of the dielectric layer to one or more pads 246 on the second end 236b. Pad 244 may be electrically connected to the common line 240, for example, through via-holes (not depicted here)—from the first surface to the second surface. Pad 244 may be configured to connect (e.g., by soldering) to a corresponding common pad on the PCB carrying the electronic circuitry. One or more wires 248 may be used to connect the one or more pads 246 on the second end 236b, to a common contact of the integrated electronic module 110 (not shown here), e.g., using wire bonding technique.

It is noted that when the integrated electronic module 110, has light sources formed by VCSELs, the common contact is conveniently disposed on the surface of the die opposite to the surface of the individual control contacts to the VCSELs. Thus, if the VCSELs die is assembled with the array of individual contacts facing the sub-mount, then the common contact may face the opposite direction, being disposed on the front side of the die, thereby being accessible for such wire bonding. The common line may be electrically connected to a pad (not shown here) on the first surface of double flex circuit 232, which is configured, in turn, to be soldered to the sub-mount (or to the light sources die) thus eliminating the need for wire bonding. The wires 248 may be relatively thin, having a diameter smaller than e.g., about 200 µm or smaller than about 100 µm or even smaller than about 25 µm. Correspondingly, several wires (rather than only one wire) may connect the common line 240 to the common contact on integrated electronic module 110, so as to maintain mechanically-flexible, yet good conduction path, thereby providing a relatively small voltage drop on such connection during operation. It is noted that wire-bonding technique may be used, according to some embodiments, to connect the electronic circuitry on the boards 222 and the sub-mount (or the integrated electronic module 110) using a mechanically flexible connection. It is further noted that variations of the technology described above may be contemplated. For example, according to some embodiments, a multi-layer flex circuit may be used for connecting the electronic circuitry 220 and the light sources. It is alternatively possible for the common contact and the signals contacts to be disposed on the same side of the light-sources die, thus allowing connection to the die from a single side thereof.

Figure 3D:
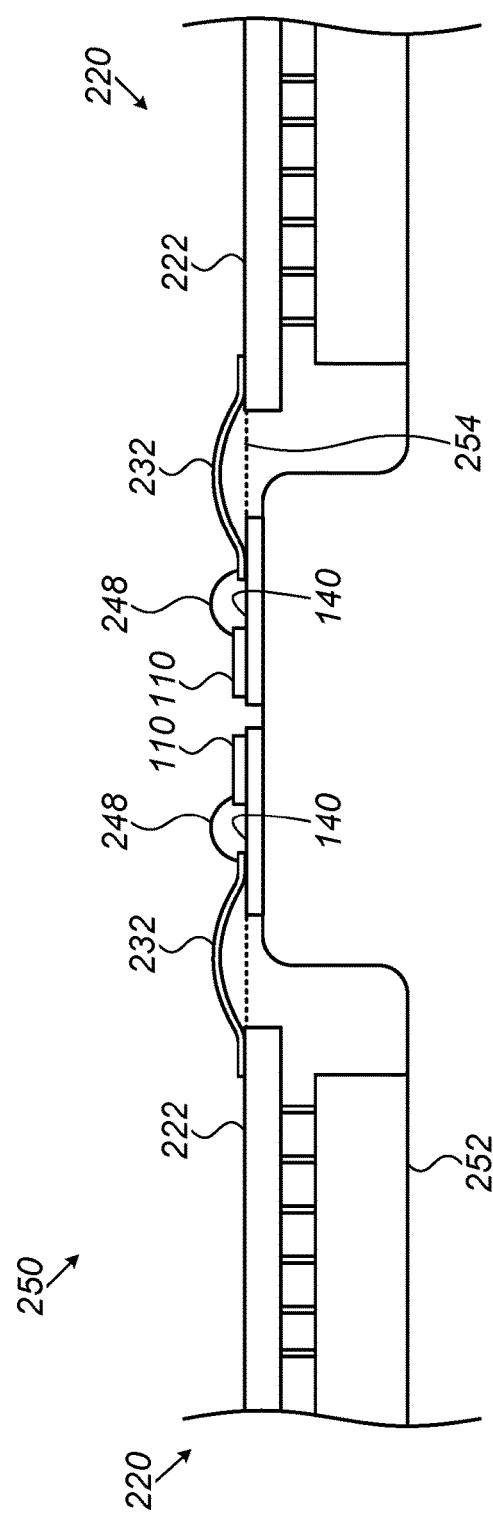
FIG. 3D schematically depicts an exemplary embodiment of a writing module wherein the sub-mount and the electronic boards are assembled onto the heatsink so as to align along a common plane.

The use of flex circuits 230 for electrical connection between the sub-mount 140 and the boards 222 allows a relatively simple, massively parallel, electrical connection over the "corners" between bottom face 212 and the side faces 214 and 216 of heatsink 210. Also, flex circuits 230 allow a relatively simple connection between two different substrates of the module—namely the sub-mount and the electronic boards—as integrated electronic module 110 may, preferably, not be assembled onto a board such as a PCB, and electronic circuitry 220 may, preferably, not be installed directly on sub-mount 140. FIG. 3D schematically depicts an embodiment of a writing module 250 wherein the sub-mount 140 and the electronic boards 222 are assembled onto a heatsink 252 aligning along a same plane. The sub-mount 140 and the electronic boards 222 are connected via a massively-parallel flexible connection, e.g., double flex circuits 232. It is noted that, even in the configuration of writing module 250, a rigid connection between the electronic boards 222 and the sub-mount (or with the die of integrated electronic module 110), instead of double flex circuits 232 (or, for that matter, any type of flex circuit), might be less than optimal. First, inevitable mechanical misalignment and tolerances of the mutual positions of the sub-mount (or the die) and the boards of the electronic circuitry may decrease or jeopardize the reliability or durability of such a rigid connection. Moreover, due to different temperatures and different temperature expansion coefficients of the sub-mounts 140 and the boards 222, a rigid connection therebetween might affect detrimentally the mechanical integrity of one, or both, during operation.

It is noted, however, that the relatively high density of conductors on flex circuit 230 poses an upper limit or at least a barrier on the available conducting cross-section of each conducting line, thereby implying an upper limit or at least a barrier on the current that may reliably be conducted in such a conducting line. The following is a non-limiting numerical example illustrating the tight constraints associated with the conducting lines of flex circuit 230. The example employs some common assumptions as detailed above regarding the current conducting lines on the sub-mount 140. According to the example, the lateral spacing of light sources along the Y direction is of about 50 µm, hence a total width of each conducting line together with an adjacent spacing to a next conducting line may roughly be about 100 µm. Assuming a conducting line width of about 70 µm, a spacing of about 30 µm between conducting lines and metal thickness of about 10 µm, then a current of 300 mAmps generates a temperature rise of about 60° C. in the conductor (in ambient air, and independent of the conductor length). It is noted in this regard that according to presently available technology, the thickness of a conducting line having a width of several tens of micrometers, on a flex circuit, may not typically exceed 10 µm, and may even be limited to yet a smaller value. 500 mAmps of current generate in the same configuration a temperature rise of 170° C., a power loss of about 300 mW, and a voltage drop of about 0.6V on a 30 mm-length conductor. It should be noticed that a 300 mW power loss is equivalent, namely roughly equal, to a required light power from each light source according to some embodiments. In other words, a 500 mA of driving current through the conducting lines of the present example may result in significant efficiency loss and therefore a tremendous heat removal problem. Moreover, a voltage drop of a few tenths of a volt on the conducting lines (e.g., about 0.6V as in the example above) may pose difficulty in the calibration of power output from each light source. Furthermore, it should be understood that if the spacing of the light sources along the Y direction is smaller than 50 µm (possibly allowing a higher address resolution, and hence higher printing resolution) then the conducting line width should preferably be lower, resulting in yet even more tight constraints on the allowed current through the conductor.

Writing Module's Electric Circuitry

In some embodiments, electronic circuitry 220 may comprise a current driving stage configured as a voltage source to light source 120. Additionally, or alternatively, electronic circuitry 220 may comprise a current driving stage configured as a current source to light source 120. It is noted that two VCSELs may differ in electrical resistance when activated and driven by a same current or by a same voltage. Moreover, the electrical resistances of two different conducting lines between two VCSELs and the associated driving stages, may be different from one another. Hence, a same current driven into two VCSELs may require a different voltage at the output port of the associated driving stages. It is further noted that different individual VCSELs may require different levels of current, to output a same level of light power. Hence an individual calibration function may be established for each VCSEL, the function defining the current (or voltage, in some embodiments) that should be provided at the output of the associated driving stage, to produce a pre-determined light power by a particular VCSEL. It should be understood that due to temporal changes that may occur to the VCSEL and/or to the conducting lines thereto, the calibration function may preferably be updated periodically or intermittently, by employing a calibration process.

Figure 4B:
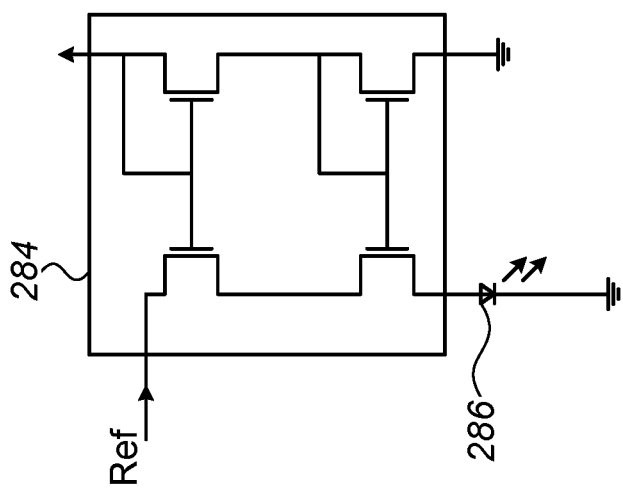
FIG. 4B depicts schematically a particular implementation of a current driving stage of the VCSEL driving module of FIG. 4A, configured to drive current suitable for activating some embodiments of a GaAs VCSEL-based light source.
Figure 4A:
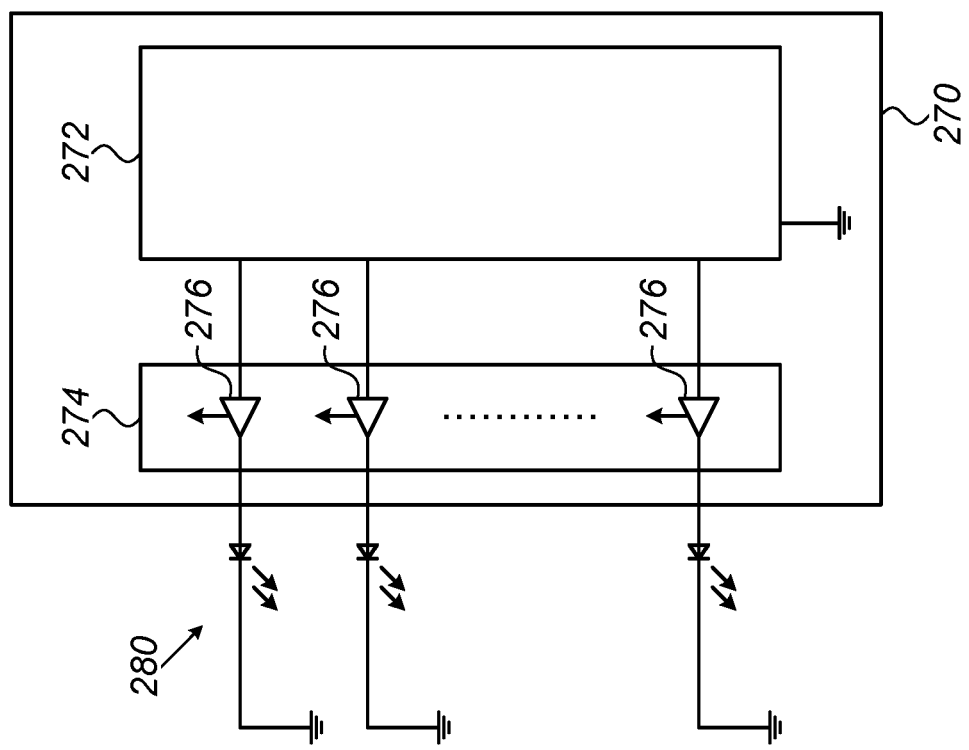
FIG. 4A schematically depicts a block diagram of an embodiment of a driving module, configured to electrically associate to a multitude of light sources comprising light emitting diodes for the individual activation thereof.

FIG. 4A schematically depicts a block diagram of an embodiment of a driving module 270, configured to electrically and individually connect to a multitude of light sources 280 comprising VCSELs, and thereby drive suitable currents to the light sources (previously schematically illustrated by dots 120 in FIG. 2A). Driving module 270 comprises a control module 272, configured to receive commands to activate or deactivate any single light source or any combination of light sources 280. Control module 272 is further configured to receive calibration data, associating, for each of light sources 280, a driving current (or an input voltage, according to some embodiments) with a light output power. Driving module 270 further comprises a driving stage module 274, comprising a multitude of driving stages 276. Each driving stage 276 is configured to receive from control module 272 a signal indicating a current (or a voltage) that should be driven to an associated light source 280. Driving stage 276 is further configured to output the required current (or, in some embodiments, the required voltage), so as to yield a desired light output from the associated light source.

FIG. 4B depicts schematically a particular implementation of a current driving stage 284 configured to drive current suitable for activating some embodiments of a GaAs VCSEL light source 286. Current driving stage 284 may be configured to switch VCSEL light source 286 between two levels of output light power, namely between an ON state and an OFF state (equivalent to zero-output power), generally requiring different current levels to be supplied to the different VCSELs (at least in the ON state) to produce a same output light power, as explained above. Alternatively, current driving stage 284 may be configured to activate VCSEL light source 286 at more than two levels of output light power, namely to activate VCSEL light source 286 to produce an intermediate power of light output, in addition to producing a maximum power output level and a zero-power output level. According to some embodiments, current driving stage 284 may activate VCSEL light source 286 at more than four different levels of output power, or more than six or more than ten, or even more than fifteen different levels of output light power. The use of several calibrated levels of output light power is advantageous in a printing system, for enabling fine-tuning of printed line widths and fine tuning of printed regions' border lines. Additionally, or alternatively, various calibrated levels of output light power may enable, respectively, printing of various dot sizes within a pixel or within a pre-defined area comprising several pixels, thereby enabling controlling the grey level of a printed region. Furthermore, according to some embodiments, the use of several calibrated levels of output light power may enable compensating for a failed light source by using neighboring light sources, as exemplified below in FIGS. 5A-5D.

In some embodiments, driving stage 276 or current driving stage 284 is configured to drive into a VCSEL light source a current greater than about 50 mA, or greater than about 100 mA, or greater than about 150 mA. In some embodiments, driving stage 276 or current driving stage 284 is configured to drive into a VCSEL light source a current of less than about 200 mA. In some embodiments, driving stage 276 or current driving stage 284 is configured to supply a VCSEL light source a switching voltage which is determined according to the number of semiconductor junctions connected in series in the light source. For example, for a light source having two semiconductor junctions of GaAs (each functioning as an active region), driving stage 276 or current driving stage 284 may be configured to supply a maximal driving voltage between 3V and 8V. For driving a light source having three semiconductor junctions of GaAs operating in series, driving stage 276 or current driving stage 284 may be configured to supply a maximal driving voltage between 5V and 15V.

FIGS. 5A-5D illustrate schematically power profiles of light spots generated by a group of neighboring light sources, and the resulting combined power profile delivered by the group. It is emphasized that, for sake of explanation, the figures relate to a simplistic, one-dimensional example of idealised light spots arranged along a line, whereas a more realistic and quantitative analysis should take into account the two-dimensional nature of the light spots on the imaging surface during printing system operation.

FIG. 5A illustrates spot profiles 502a-502g of the power of seven light spots arranged along the Y axis. The spot profiles are assumed to have a Gaussian shape of arbitrarily-selected maximal intensity of about 1 and half width at half maximum of about 1. A combined profile 504 represents the total power, namely the sum of the powers of the spot profiles, along the Y axis. Polymer on the imaging surface is assumed to be modified (e.g., be softened or liquified) by the radiation at points where the combined power profile 504 exceeds a value of h (selected in this example to equal about 1.4). Consequently, the polymer is modified along a print line 508 of length 6, between about y=0 and about y=6.

A situation where one light source is inoperative is depicted in FIG. 5B. FIG. 5B illustrates spot profiles 522a-522d and 522f-522g, of the power of 6 light spots arranged along the Y axis as in the example of FIG. 5A. It is noted that a spot profile 522e is absent, representing an inoperative seventh light source. As a result, a combined profile 524 does not exceed the threshold h between about y=3 and y=5, resulting in a print line 528 fragmented to two fragments namely 528a and 528b. A similar outcome might have been obtained, were the inoperative light source merely defective so that its reduced spot profile does not suffice to allow reaching the threshold, even in combination with neighboring profiles of operative light sources.

Figure 5C:
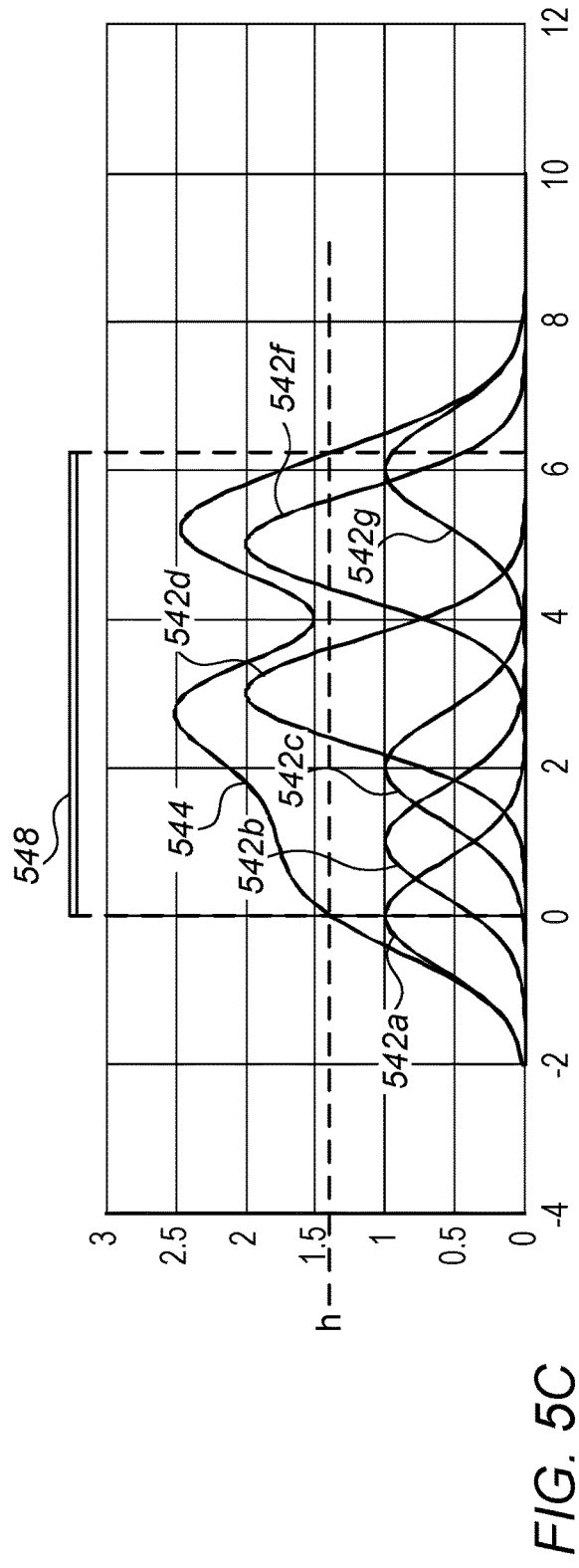
FIG. 5C illustrates spot profiles of the light sources of FIG. 5B, wherein the light sources on both sides of the inoperative light source produce double the power so that a combined profile exceeds the threshold h.

To overcome the problem of a fragmented print line as a result of an inoperative or defective light source, the power of light sources neighboring to the defected light source may be increased, as is demonstrated in FIG. 5C. In this example, spot profiles 542*d* and 542*f* (on both sides of an absent spot profile 542*e*) are doubled in power, reaching a maximal intensity of 2. A combined profile 544 exceeds the threshold h continuously in the section between about y=0 and about y=6.2, hence a print line 548 may be formed continuously along the said section. Thus, increasing the output light power of a light source beyond a nominally standard level, may be used to compensate for a neighboring light source which is inoperative or defective. It should be noted that due to the increase in amplitude of spot profile 542*f*, print line 548 extends beyond the point of y=6 demonstrated in FIG. 5A. However, fine tuning the location of the end of the print line, namely fine-tuning the location where the combined profile 544 crosses the threshold h, may be achieved by fine-tuning the intensity of spot profile 544*g*, as is demonstrated in FIG. 5D.

Figure 5D:
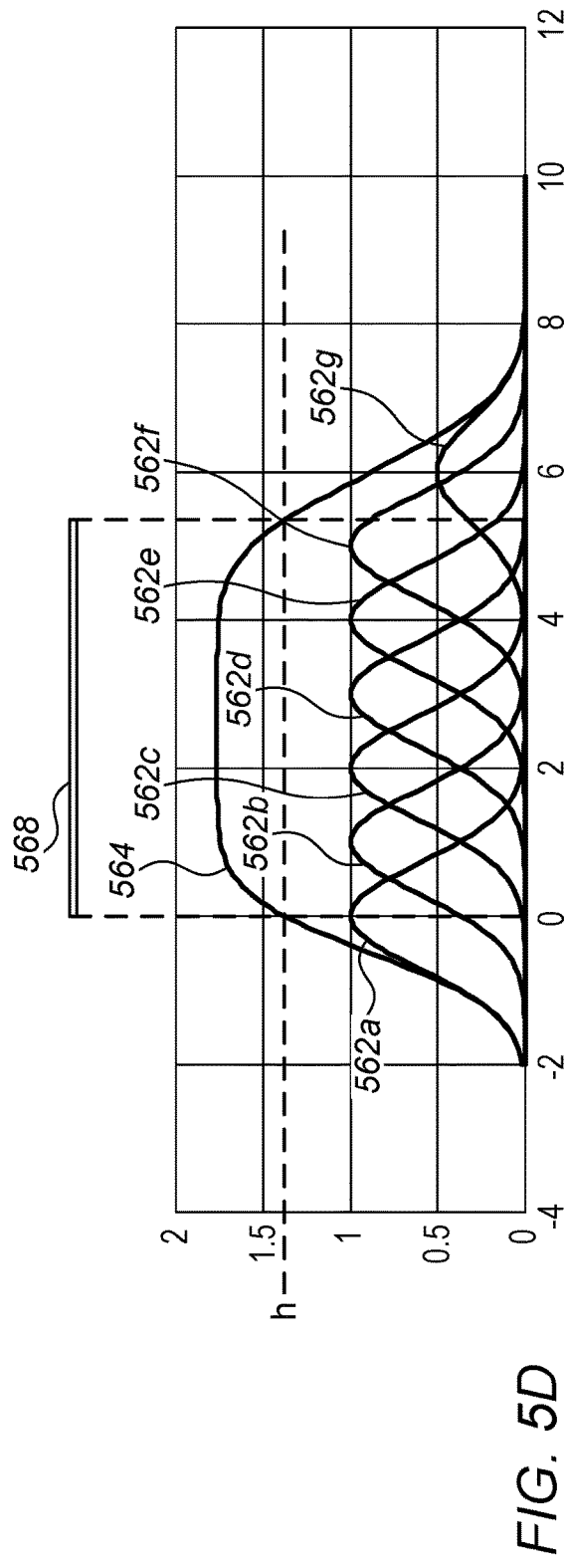
FIG. 5D illustrates spot profiles of seven light sources wherein the spot profile on the right-hand side has half the intensity so that a combined profile crosses the threshold h over a shorter distance, compared to the illustration of FIG. 5A.

FIG. 5D illustrates spot profiles 562*a*-562*g* whereas spot profiles 562*a*-562*f* have a nominally standard intensity of 1, and spot profile 562*g* has half the intensity, namely a maximal intensity of 0.5. As a result, a combined profile 564 crosses the threshold h on the right-hand side of the illustrative plot at about y=5.5. Consequently, a print line 568 extends between about y=0 and y=5.5 being short by about 0.5 units length compared to the print line 508 in the example demonstrated in FIG. 5A. It should be understood that even finer tuning of the length of print line 568 (namely fine tuning the location of one of the ends thereof) may be obtained by tuning the intensity of the spot profiles near these ends, namely 562*a* and/or 562*g*, to intermediate levels between 0 and maximal intensity, other than 0.5. It is therefore concluded that by suitably controlling power levels of the spot profiles, printing resolution which is considerably higher than the address resolution (that is, the spacing between light sources on the Y axis) may be attained.

As discussed above with reference to FIGS. 2, 3 and 4, the driving stages of the electronic circuitry are preferably positioned close to the light sources. For example, driving stages 276 are preferably positioned close to light sources 280 in FIG. 4A. Minimizing the length of conducting lines between the driving stages and the light sources, results in minimizing power loss and heat dissipation on such conducting lines, minimizing signal distortions due to parasitic inductance and mutual capacitance of the conducting lines, and maximizing switching bandwidth of the driving module 270. Returning to FIGS. 3A and 3B, the driving stages (such as driving stages 276 of FIG. 4A, for example) for driving current to the multitude of light sources in arrays 112, are arranged in electronic chips 290 (depicted here within conventional electronic packages 292), deployed on boards 222. In the embodiment of FIGS. 3A and 3B, each electronic chip 290 is electrically associated with the light sources in two neighboring arrays 112 along one of the lines 118*a* or 118*b*. Thus, for example, if a single array 112 comprises five rows and five columns of light sources at a grid spacing of 50 μm along the Y axis, then each array comprises twenty-five light sources, capable of radiating along a continuous segment of about a 1.25 mm length along the Y direction. Accordingly, a single electronic chip is electrically associated with fifty individual light sources, spanning together two such non-consecutive segments along the Y axis. Hence, two electronic chips 290, positioned oppositely to one another on the two boards 222*a* and 222*b*, are electrically associated with hundred light sources, spanning together a consecutive segment of about 5 mm length along the Y direction. Thus, a row of electronic chips 290, packaged in electronic packages 292, each having a width (as measured along the Y direction) of about 4.5 mm may be installed side by side with a 0.5 mm gap in between, on each of the boards 222*a* and 222*b*. Each electronic package may further have a length (measured along the Z direction) of about 1 cm or 2 cm or even 3 cm, and a subsequent area of about 0.5 cm$^2$ or 1 cm$^2$ or even 1.5 cm$^2$, such area being configured to allow heat dissipation from the electronic chip into the heatsink 210.

As an illustrative example, electronic chip 290 may be configured to switch ("on" and "off" only) 50 individual GaAs VCSELs, wherein the maximal ("on") current is about 50 mA, and the voltage drop on each driving stage during "on" time is about 2V. Hence the electronic chip may consume a maximum power of about 5 W and may span an area of about 70 mm$^2$. As explained above, modifying a polymer for accomplishing the print process typically requires a pre-determined energy density defined as the energy per unit length of the print format. Thus, the power density required for the process being derived from the energy density is linearly dependent on the printing speed. In other words, if the printing speed is doubled, then the power density required for the printing process should generally be doubled also, necessitating the doubling of the maximal VCSEL current and power consumption by the controlling electronic circuitry. It may further be appreciated by the person skilled in art of electronics and in particular the art of circuits design and micro-electronic packaging, that the density of VCSEL light sources, i.e. the number of sources per unit area, may be higher in some embodiments for example, the grid spacing of the VCSEL light sources along the Y direction may be smaller than 50 μm, being for example 40 μm or 30 μm or even 20 μm. Each electronic chip 290 is then preferably configured to switch a correspondingly higher number of VCESLs light sources, e.g., about 60, or about 80 or about 120 individual VCESLs light sources. As a result, the area of each chip may correspondingly be larger, as more switches are integrated on a single chip, and heat dissipation on the chip during operation may be larger too. Also, if the driving stage is configured to drive current at several non-zero current levels to obtain light radiation at several non-zero levels (as exemplified e.g., in FIGS. 5C and 5D), then also the average heat dissipation on the chip is larger, and the area of the chip should also preferably be higher (compared to an embodiment configured for only on-off switching). It may further be appreciated by a person skilled in the art that a layout of electronic circuitry 220 may be realized by many embodiments other than those explicitly detailed above. For example, electronic chips such as 290 may be configured to be associated to a different number of arrays 112, in particular to a greater number than 2 arrays, for example to 3 or 4 arrays or more, thereby reducing dead space in boards 222 due to gaps between packages 292, hence allowing a greater chip area for heat removal.

Writing Module's Light Sources

Figure 6A:
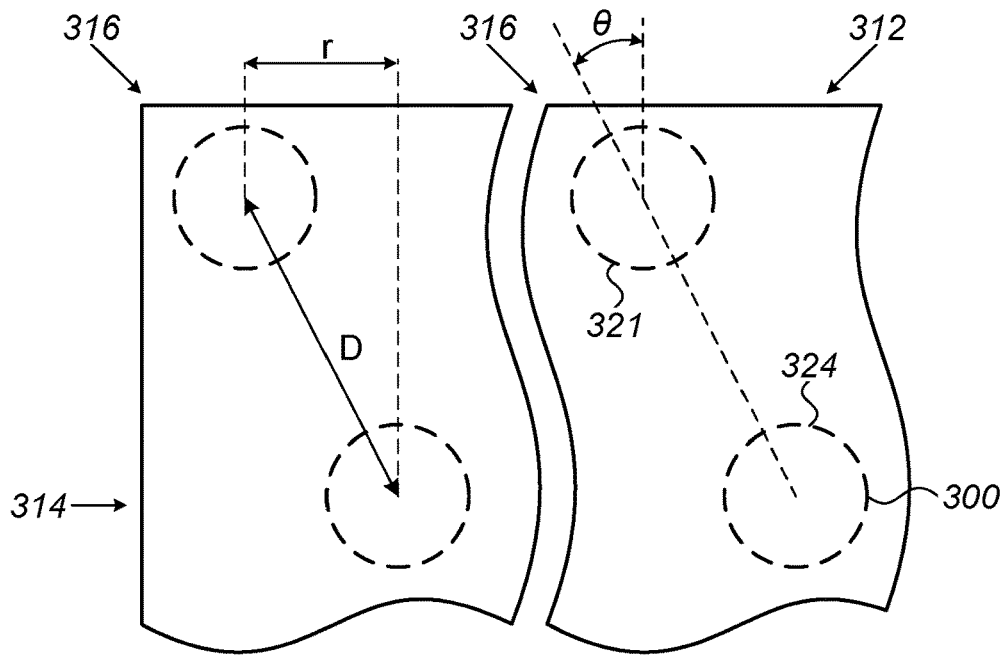
FIG. 6A depicts a portion of an array of light sources each comprising a cluster of VCSELs disposed adjacently to one another and electrically connected to one another in serial.
Figure 6B:
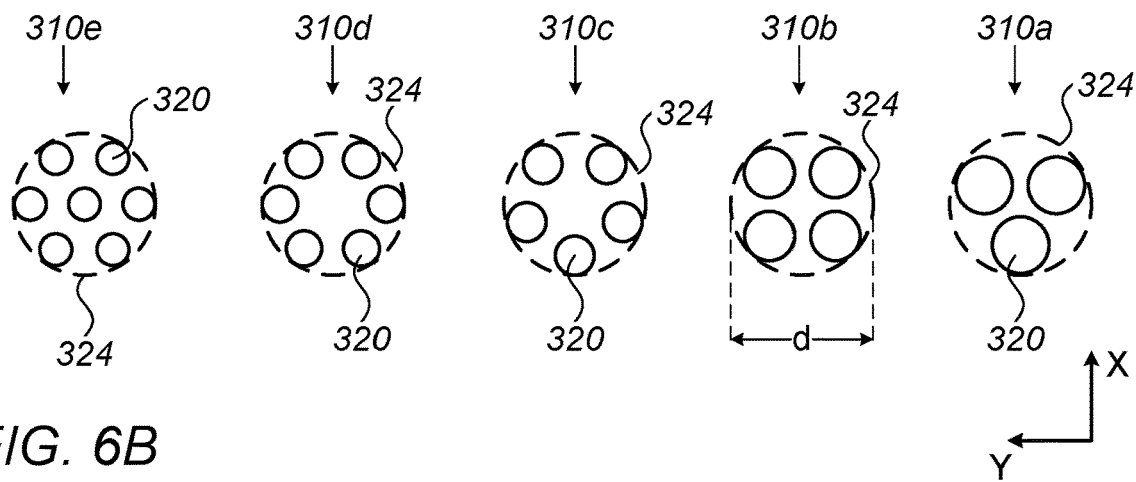
FIG. 6B schematically depicts some different exemplary embodiments of the light sources of FIG. 6A, comprising clusters VCSELs.
Figure 6C:
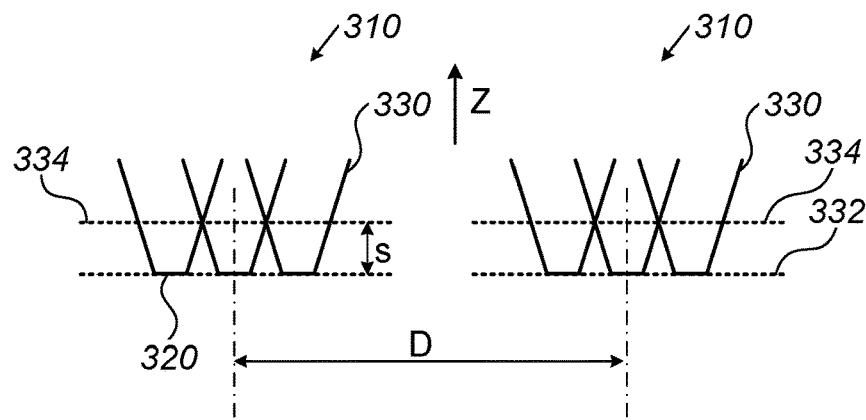
FIG. 6C depicts schematically a side view of two clusters of VCSELs, and light beams generated by the VCSELs.
Figure 6D:
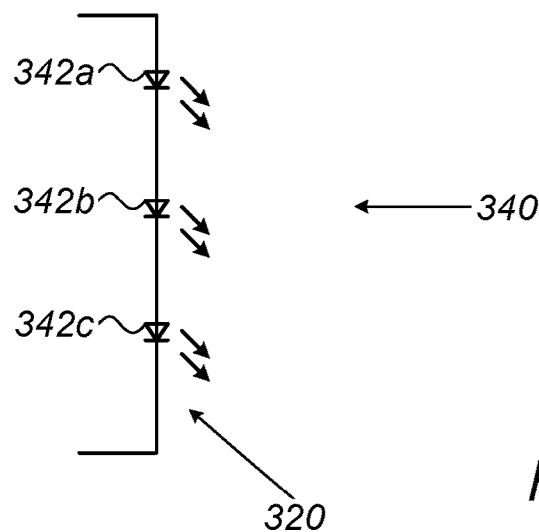
FIG. 6D schematically depicts an equivalent electrical circuit of a cluster of VCSELs electrically connected in series.
Figure 6E:
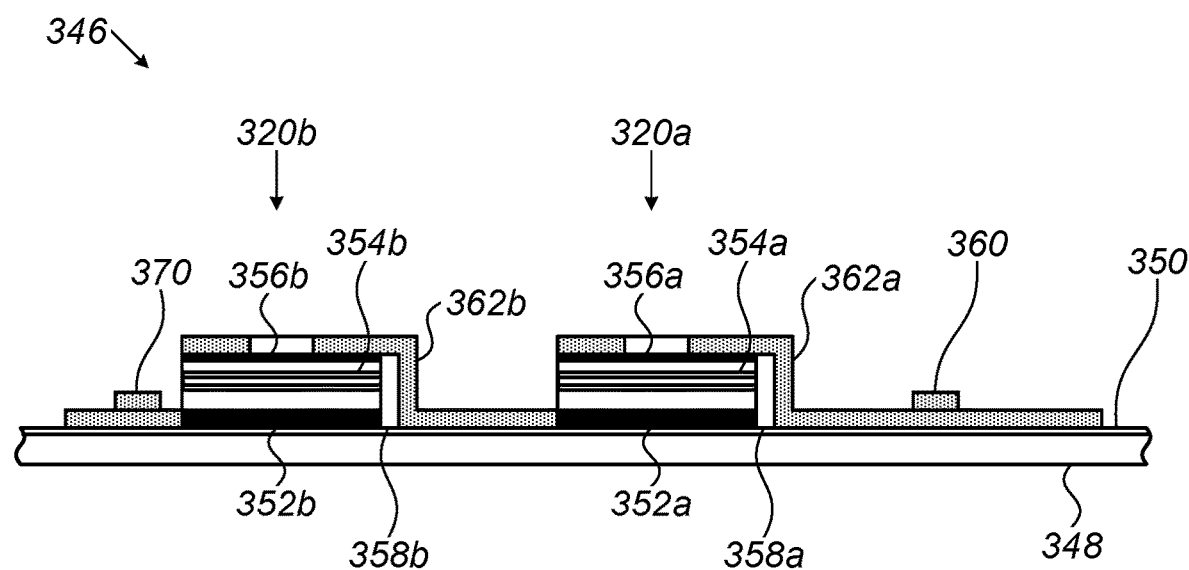
FIG. 6E schematically depicts a cross-section view of two VCSELs connected in serial in a two-VCSELs cluster.

FIGS. 6A 6E depict some embodiments of a light source 300 comprising a cluster 310 of VCSELs disposed adjacent to one another and electrically connected to one another in series. FIG. 6A depicts a portion of an array 312 of light sources 300, comprising rows 314 and columns 316, skewed so that the rows 314 are parallel to the Y direction whereas the columns 316 are tilted at an angle θ relative to the X direction, as is described above regarding array 112. In the array, a distance between neighboring light sources is marked D (denoted here along column 316). A grid spacing along the Y direction—that is to say, the distance between neighboring projections on the Y axis of the locations of the light sources—is denoted r. As explained above, r determines the address resolution, being related to (and in some embodiments being equal to) the printing resolution of the printing system. The distance D, in some embodiments, is determined by various manufacturing considerations, some being explained above. In some embodiments, the distance between neighboring light sources along row 314 is roughly equal or exactly equal to the distance between neighboring light sources along column 316.

FIG. 6B schematically depicts five different embodiments of light source 300, comprising clusters 310a, 310b, . . . 310e, of three, four, five, six, and seven VCSELs 320, respectively. VCSELs 320 in each cluster are configured and operable to radiate together, and are spatially arranged and optically configured to produce a single light spot on the imaging surface of the printing system when activated, as is further explained below. A diameter (or dimension) of light source 300 is denoted d and is determined by a diameter of a circle 324 encompassing the cluster 310 of VCSELs 320 of the single light source. Correspondingly, d may be smaller or larger than r and is typically roughly equal to r, whereas D is typically larger than d.

FIG. 6C depicts schematically a side view of light beams 330 generated by two clusters 310 of VCSELs 320. The divergence angle of light beams produced by VCSELs according to currently available technologies is typically in the range of 5-25 degrees (half angle). Thus, the distance s between a plane 332 of the active region of the VCSELs and a plane 334 wherein adjacent light beams merge (coincide) is about 1.5 to 5 times the distance between neighboring VCSELs in a cluster (here s is measured along the optical axis of the VCSELs, coinciding with the Z axis). If the distance between neighboring VCSELs is, for example, 10 μm, then the distance between the planes 332 and 334 may be about 15-50 μm.

Cluster 310 may produce a single light spot on the imaging surface using the optical system (not shown here) of the printing system. According to some such embodiments, the optical system—such as, e.g., optical system 128 in FIG. 2A—may be configured to image onto the imaging surface the plane 334 or another plane which is distal from the plane 332 of light sources. In other words, the optical system may be tuned to image light sources 300 onto the imaging surface with some defocus typically a slight defocus, thereby blurring the image of the light sources on the imaging surface, and thereby forming from the light beams from each cluster 310 a single light spot. Additionally, or alternatively, inevitable blur of the optical system, resulting for example from aberrations or diffraction, may cause imaging the cluster on the imaging surface as a single spot, even without defocus.

In some embodiments, the arrangement and orientation of VCSELs 320 in cluster 310 is preferably determined relative to the X direction so that traces of the activated VCSELs (in a single cluster) overlap and merge into a single light spot on the imaging surface (not depicted here) during the duration of a single pixel formation. In other words, within the duration of a single pixel wherein light source 300 is activated, each light beam emerging from a VCSEL traces a short line on the imaging surface due to the continuous motion of the imaging surface. Thus, each VCSEL leaves on the imaging surface a trace, the length of which is determined by the pixel duration and the imaging surface' velocity, and the width of which is determined by the diameter of the light beam on the imaging surface. The partial overlap and merger of the light beams of each cluster 310, together with the motion of the imaging surface during the pixel duration, hence produce a single light spot from the cluster of VCSELs.

FIG. 6D schematically depicts an equivalent electrical circuit 340 of a cluster of VCSELs electrically connected in series. Circuit 340 comprises, as an illustrative non-limiting example, three VCSELs 320 represented as light-emitting diodes 342a, 342b and 342c, respectively, connected in series, each having an active region comprising one junction. At a selected working point, a single VCSEL 320 may produce a light output power of $$P = \eta \cdot I \cdot V, \quad (1)$$

where I and V are the operating current and voltage, respectively, and η is the power conversion efficiency. A cluster of VCSELs as represented by circuit 340 may produce the sum of light output powers, namely $P_3 = I \cdot (V_1 \cdot \eta_1 + V_2 \cdot \eta_2 + V_3 \cdot \eta_3)$, wherein the subscripts 1, 2 and 3 represent the three different VCSELs. $P_3$ may further be presented in a more simplistic formula, assuming an average voltage drop V on each of the three VCSELs and an average power conversion efficiency η, $P_3 = \eta \cdot I \cdot 3V$. In other words, such cluster of three VCSELs may output roughly three times the light output power of a single VCSEL, at the same operating current.

More generally, a light source 300, comprising a cluster 310 of VCSELs may be configured (e.g., the number of VCSELs in the cluster be determined) in a process according to the following sequence of steps: first, a desired operating current for the light source may be selected. Such a desired operating current may be selected so as to determine a relatively highly-efficient working point for a single VCSEL in the cluster, and also while considering limitations of current-conducting lines and switching frequency of the circuitry associated with the VCSEL, as explained and detailed herein above. Then, the light output power of a single VCSEL at the selected working point may be estimated using the light output power equation (1) given above. Then, the desired light output power from a single light source may be divided by the light output power of the single VCSEL, to determine the required number of VCSELs in the cluster.

FIG. 6E schematically depicts a cross-section view of two VCSELs, 320a and 320b, respectively, connected in series in a two-VCSELs cluster 346 (the suffixes 'a' and 'b' to numerals of this figure representing elements in the respective VCSELs 320a and 320b). The VCSELs are constructed above a substrate 348, being isolated therefrom by a thin isolating layer 350. Each VCSEL comprises a bottom Bragg reflector 352, a partially-reflecting top Bragg reflector 356 above bottom Bragg reflector 352, and an active region 354 between the bottom and top Bragg reflectors. The VCSELs typically further comprise an oxidized layer having a conducting aperture (which is not explicitly depicted here) for confining the current and thereby defining the beam width. A positive electrical contact 360 may generally reside on top of the substrate 350, being electrically separated therefrom by the insulating layer 350. An electric conductor 362a (e.g., a metallic channel) may be brought up from the positive electrical contact 360 to above the upper Bragg reflector 356a. Electric conductor 362a electrically contacts upper Bragg reflector 356a of VCSEL 320a, and is further electrically isolated from other parts of VCSEL 320a by a dielectric layer 358a. Likewise, an electric conductor 362b may electrically connect bottom Bragg reflector 352a with an upper Bragg reflector 356b of VCSEL 320b, being isolated from other parts of VCSEL 320b by a dielectric layer 358b. A negative metal contact 370 of the cluster may contact a bottom Bragg reflector 354b, possibly residing on a same plane therewith (generally coinciding with the plane of bottom Bragg reflector 352a). Both negative metal contact 370 and bottom Bragg reflector 352b are electrically insulated from substrate 348 by insulating layer 350. The cluster of FIG. 6E may thus be activated by applying a voltage between the positive and negative metal contacts 360 and 370 respectively, whereas the voltage drop between the contacts is the sum of the voltage drops on VCSELs 320a and 320b, and whereas the current through the two VCSELs is the same.

It is noted that a writing module according to the teachings herein, incorporating the serially-connected cluster such as clusters 310 or cluster 348, is advantageous over an alternative writing module incorporating a cluster of VCSELs connected in parallel to each other (herein denoted parallel-connected, and not depicted here as it falls outside the scope of the invention as claimed). It is first noted that a desired working point, involving a total output light power and an optimum, or close-to-an-optimum VCSEL current, may be employed with a parallel-connected cluster as much as with a serially-connected cluster. In other words, once a desired (e.g., optimum efficiency) current is selected for the single VCSEL, the number of VCSELs in the cluster may be selected as described above by dividing the total required power from the cluster by the light power delivered by a single VCSEL at such an optimum working point. Further, the whole cluster may be supplied with a voltage determining the said optimum current, thereby obtaining from a parallel-connected cluster, having the same number of VCSELs as a serially-connected cluster, the same total light power.

It is recognized that, in some respects, a parallel-connected cluster, by itself, may have certain advantages over a serially connected cluster of VCSELs. One such advantage is that the construction of a parallel-connected cluster is simpler than the serially connected cluster described for example in FIG. 6E and is simpler to construct because the respective connected elements of the VCSELs lie in the same plane. Another advantage of a parallel-connected cluster is higher reliability, because a disconnection (electrical break) within one of the VCSELs in a serially connected cluster renders the whole cluster inoperative, whereas in a parallel connected cluster, a disconnection within one of the VCSELs renders only the faulty VCSEL inoperative.

Despite of the above-mentioned possible advantages of parallel-connected clusters over the serially-connected clusters, the writing module incorporating serially-connected cluster is deemed to be the more advantageous. One reason is that parallel-connected clusters require relatively high current (at a relatively low voltage), thus imposing severe complexity on the arrangement of current conducting lines to the VCSEL electronic integrated module, as explained in detail above. Second, switching the parallel-connected cluster might require more complex electronic circuitry and/or of much larger surface area due to the higher current required by the parallel-connected cluster.

Figure 7A:
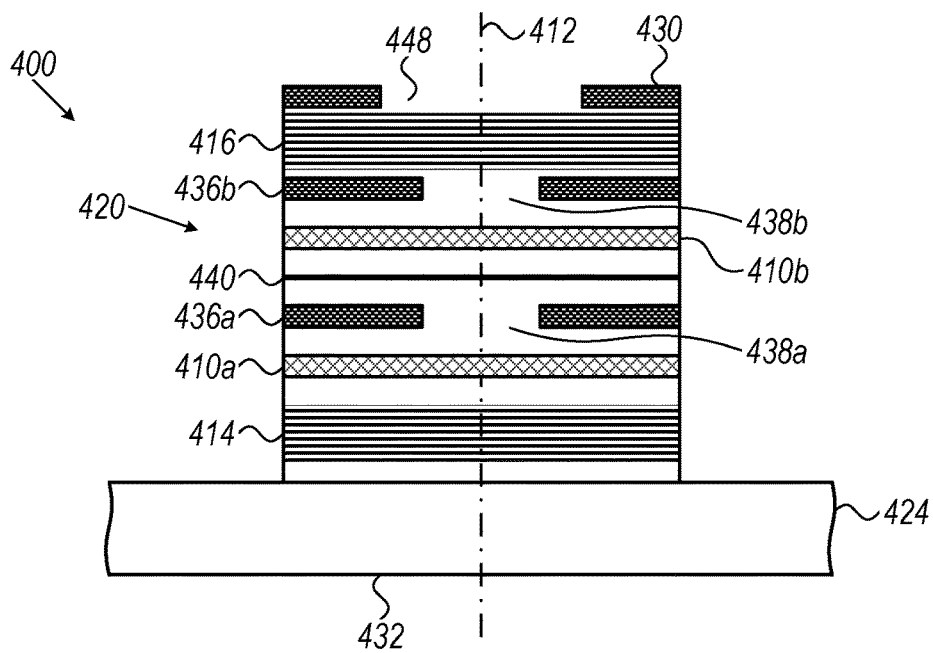
FIG. 7A depicts in a cross-section view a structure of a cascade VCSEL.
Figure 7B:
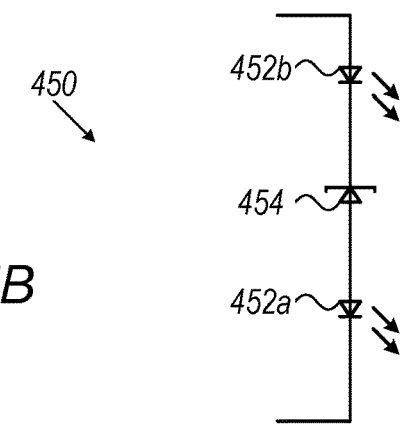
FIG. 7B depicts schematically an equivalent circuit of the cascade VCSEL of FIG. 7A.

Cascade VCSELs utilize a further arrangement of light-emitting semiconductor junctions connected in series according to the teachings herein. FIG. 7A depicts in a cross-section view of a structure of an exemplary embodiment of a cascade VCSEL 400, and FIG. 7B depicts schematically an equivalent circuit 450 thereof. Cascade VCSEL 400 comprises two active regions 410a and 410b respectively, disposed on two planes parallel to each other along an optical axis 412 of the cascade VCSEL. A bottom Bragg reflector 414 below active region 410a and a partially-reflecting top Bragg reflector 416 above active region 410b determine therebetween a cavity 420 of cascade VCSEL 400. According to some embodiments, bottom Bragg reflector 414 may conveniently comprise an n-doped GaAs, being constructed from epitaxial layers on top of an n-doped substrate 424 of VCSEL 400, whereas top Bragg reflector 416 may consequently comprise a p-doped GaAs. Cascade VCSEL 400 may be activated by driving a current between a top contact 430 (positive contact) attached to top Bragg reflector 416 and a bottom contact 432 (negative contact) attached to substrate 424 (or to bottom Bragg reflector 414).

Two oxidized layers 436a and 436b, respectively, are arranged above the active regions 410a and 410b, respectively and parallel thereto. Each oxidized layer 436a and 436b, has an unoxidized, electrically conducting aperture 438a and 438b, respectively, centered around optical axis 412 for confining the electric current through the active regions 410a and 410b within the apertures and thereby determining the effective light beam diameter produced by the cascade VCSEL. Top contact 430 comprises an opening defining an aperture 448 centered around optical axis 412, thereby allowing cascade VCSEL 400 to emit radiation from the top surface (e.g., top Bragg reflector 416) thereof. According to some embodiments, a tunneling diode 440 may be constructed between each two active regions in the cascade VCSEL—specifically between active regions 410a and 410b in cascade VCSEL 400—to regenerate charge carriers from combined electron-hole pairs.

Drawing attention to FIG. 7B, equivalent circuit 450 comprises two junctions represented as light emitting diodes 452a and 452b, respectively, connected in series, corresponding to the active regions 410a and 410b, respectively. A tunneling diode 454 is connected in series between diodes 452a and 452b, corresponding to the tunneling diode 440 in FIG. 7A in between the active regions 410a and 410b. At a selected working point characterized by a current I, cascade VCSEL 400 may produce a light output power of $$P = \eta \cdot I \cdot (V_{AR1} + V_{AR2}). \quad (2)$$

Here I is the operating current, $V_{AR1}$ and $V_{AR2}$ are the voltage drops on the active regions 410a and 410b, respectively, and η (which may typically be dependent on the current I) is a combined power conversion efficiency of the active regions. It should be noted, however, that the total power consumed by VCSEL 400 (excluding voltage drops on Ohmic resistance within the VCSEL) is $P_t = I \cdot (V_{AR1} + V_{AR2} + V_{Tunn})$, wherein $V_{Tunn}$ is the voltage drop on the tunneling diode. In other words, η above does not represent the total power conversion efficiency of VCSEL 400 and the total efficiency is yet lower than η.

A cascade VCSEL such as cascade VCSEL 400 may be configured—namely a required number of semiconductor regions connected in series may be determined—by carrying out similar steps to those outlined above or by the following steps: first, an efficient working point may be selected, indicating a desired operating current I and determining a power conversion efficiency of the active regions η. Then, the predicable output light power from a cascade VCSEL having N active regions (N being 2, 3, 4, or more) may be estimated. A cascade VCSEL configuration may be selected, comprising a selected number of active regions thereinside, so as to enable producing an output light power equal to or greater than a required light power. It is noted that a typical operating voltage for such a cascade VCSEL comprising N active regions may be estimated using the formula $V_t = N \cdot V_{AR} + (N-1) \cdot V_{Tunn}$, wherein $V_{AR}$ is an average voltage drop over a single active region, being in the range 1.5V-4V as discussed above, and $V_{Tunn}$ is an average voltage drop over the tunneling diodes in the VCSEL.

Figure 7C:
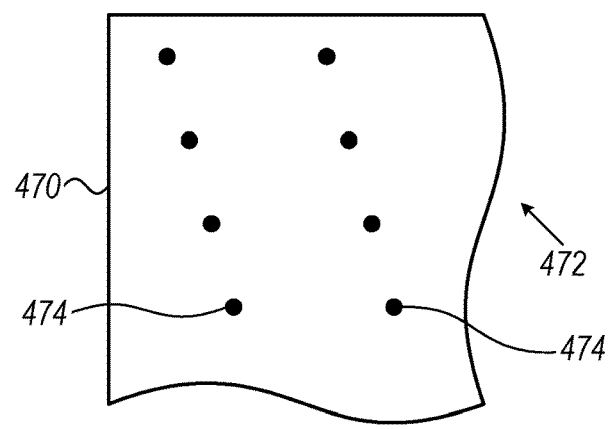
FIG. 7C schematically depicts a portion of an integrated electronic module, comprising an array of cascade VCSELs according to the teachings herein.

As indicated above, the use of a cascade VCSEL involves some power loss (compared to using discrete VCSELs, such as in a cluster, as described above) due to the voltage drop $V_{Tunn}$ on the tunneling diode, which generates power loss and reduced power conversion efficiency. In some embodiments, $V_{Tunn}$ may be comparable to the voltage drop on the VCSEL active regions, being in the range 1-2V. Moreover, the structure of a cascade VCSEL according to the teachings herein is considerably more complex compared to the construction of conventional VCSELs, resulting in a higher failure rate during manufacturing and during operation, and, generally, higher cost. Nevertheless, in some embodiments, a writing module comprising VCSEL arrays of cascade VCSELs as described herein may be advantageous over alternatives that do not incorporate cascade VCSELs. One reason is that the cascade VCSEL may provide a higher light density (compared, for example, to a cluster of ordinary VCSELs such as clusters 310 or 348). Consequently, a smaller spot size—namely a smaller pixel size—may be attained in some embodiments using a writing module incorporating arrays of cascade VCSELs. For example, cascade VCSELs may be preferred for printing with a spot size smaller than 100 µm or smaller than 80 µm or even smaller than 50 µm. FIG. 7C schematically depicts a portion of an integrated electronic module 470, comprising an array 472 of cascade VCSELs 474 according to the teachings herein. Thus, integrated electronic module 470 may be used in any of the writing modules described hereinabove, e.g., in writing modules 100 and/or 200.

The terms "thermoplastic particles" or "thermoplastic polymer particles" are interchangeably used to refer to all particles comprising a thermoplastic polymer, whether coating the particle or forming substantially all of the particle, including any intermediate range of presence of the polymer allowing the thermoplastic particles to serve their intended purposes. In the latter cases, wherein the thermoplastic polymer(s) can be homogeneously present in the entire particle, not being particularly restricted to an external coating, the particles may also be said to be made of a thermoplastic polymer. Unless otherwise stated or clear from context, the terms "polymer particles" or "polymeric particles" refer to aforesaid particles comprising a thermoplastic polymer. The polymer, or the polymer particles, need to be compatible with the radiation emitted by the light sources of the imaging device/writing module.

For instance, if a laser is used to emit light of a particular wavelength then the polymer or particles formed therewith should be able to convert the incoming radiation into thermal energy. If necessary, agents able to achieve or facilitate such conversion may be included in the thermoplastic particles. Non-limiting examples of radiation absorbing agents include dyes, fillers, organic or inorganic pigments which can be colourless or tinted. Alternatively, and additionally, the radiation absorbing agents may be present in the imaging surface, as further detailed in WO 2018/100541 to the same Applicant, published on 7 Jun. 2018.

Thermoplastic polymers are plastic materials formed of repeating units (monomers), the polymer chains associating with one another through intermolecular forces which weaken with increased temperature. Above their glass transition temperature (Tg), the thermoplastic polymers become sufficiently softened and flexible to be shaped, by a variety of processing techniques, solidifying upon cooling. Depending on their morphology below their respective Tg, thermoplastic polymers are classified into amorphous, semi-amorphous (or semi-crystalline) and crystalline plastics. Amorphous and crystalline thermoplastic polymers, having typically less than 30% or more than 70% crystalline components respectively, are believed to typically have shorter open-time than semi-amorphous thermoplastic polymers. The degree of amorphism/crystallinity of a specific thermoplastic polymer may depend on its chemical family, the degree of branching, the extent of cross-linking, the number and type of monomers present (affecting also the average molecular weight of the polymer, whether it is a homopolymer or a copolymer, its affinity towards other constituents of the system, and like factors readily appreciated by a person skilled in polymer chemistry).

For copolymers, the ratio between monomers of different chemical families and/or their distribution along the polymer chain (random or block copolymers) may also play a role on the properties of the polymers formed therefrom, including inter alia on their open-time such as within a printing system as herein disclosed. Furthermore, the monomers can have functionalized moieties also affecting the open-time of the polymer or copolymer functionalized therewith. Moreover, as thermoplastic polymers or copolymers can each display a variety of open-times, a particular value can be obtained by mixing two or more thermoplastic materials in respective amounts allowing the tailoring of a desired open-time.

Thermoplastic polymers can, for instance, be selected from polyacrylate compounds (PAN), polyamides (PA), polycarbonates (PC), polyesters (e.g., PET), polyethylenes (PE), polypropylenes (PP), polystyrenes (PS), polyurethanes (PUR), and polyvinyl chlorides (PVC), to name a few. Copolymers based on such chemistry may also provide suitable thermoplastic polymers. Functional groups that may be used to modulate the afore-said polymers and/or copolymers (whether random or block), and which in turn can modify the open-time of the thermoplastic particles, include amine groups, epoxy groups, acidic groups, such as carboxylic groups or acrylic groups, hydroxyl groups and salts.

Particles can be formed from aforesaid suitable thermoplastic polymers by any appropriate method known to the skilled person. For instance, the thermoplastic polymer particles can be prepared by a first plastic compounding step (e.g., by mixing, kneading, extruding, and like procedures, typically under elevated temperatures suitably softening the polymer) and a second size reduction step (e.g., by milling, attrition, sonication, shear mixing, micro-emulsification, etc.).

The above-listed exemplary methods may generate particles of various sizes and shapes. The thermoplastic particles can have approximately a globular/spherical shape, but can also have a flake-like platelet shape or any intermediate non-spherical form. In other words, the dimensionless aspect ratio between the smallest dimension of the particle and its longest dimension in the largest plane orthogonal to the smallest dimension can vary from approximately 1:1 for particles having an almost spherical shape, to at least 1:5 (e.g., bean-shaped particles) or at least 1:10 for non-spherical shapes (e.g., rod-like particles), some flake-like particles having an aspect ratio of at least 1:15, of at least 1:20, at least 1:40, at least 1:60, or even of at least 1:100.

In a particular embodiment the polymeric particles have approximately a globular/spherical shape with a dimensionless aspect ratio between a smallest dimension and a longest orthogonal dimension not exceeding 1:10, being typically no more than 1:5, 1:4, or 1:3, near spherical particles having an aspect ratio of less than 1:2, less than 1:1.5, and approximately 1:1. Depending on the shape of the particles, the characterizing dimensions of a particle can be at least one of the longest dimension, the smallest dimension and the diameter, such dimensions being typically provided as average values for a population of representing particles.

The average longest dimension or diameter of the thermoplastic particles generally does not exceed 10 micrometers (μm), being of at most 5 μm, at most 4 μm, at most 3 μm, or at most 2 μm. In some embodiments, the average longest dimension or diameter of the thermoplastic particles does not exceed 1,500 nm, being of at most 1,000 nm, or at most 750 nm. The average smallest dimension or diameter of the polymer particles is typically of at least 100 nm, 200 nm, or 300 nm. In particular embodiments, the average diameter of the polymer particles is between about 100 nm and about 4 μm, or between about 300 nm and about 2 μm, or between about 500 nm and about 1,500 nm.

The average size of particles can be assessed by any known technique, such as microscopy or Dynamic Light scattering (DLS), the latter being particularly suitable for particles having a near spherical shape. In one embodiment, the size of the particles is assessed on a sample of the population of particles suspended in a suitable liquid (e.g., water optionally supplemented with a dispersant), in which case the average diameter of the particles is estimated by Dv50 (maximum particle hydrodynamic diameter below which 50% of the sample volume exists) as measured by DLS, Dv10 and Dv90 providing the range within which a predominant portion of the population of particles exists. In a particular embodiment, the average size of the polymeric particles (or their average diameter when referring to spherical ones) is relatively uniform. Such relative size uniformity is believed to increase the correlation between a particular level of particles' irradiation and the outcome of resulting thermal transformation on similarly sized particles, facilitating, in other words, the reproducibility of the printing system. Size uniformity is however not essential as some variations may assist in achieving a better packing of the particles on the imaging surface, smaller ones being able to fill voids in between larger ones, hence resulting in an increased coverage of the transfer member.

Unless otherwise stated, the use of the expression "or" is inclusive and not exclusive (hence "A" or "B" includes "A" and "B"). Unless otherwise stated, the use of the expression "and/or" between the last two members of a list of options for selection indicates that a selection of one or more of the listed options is appropriate and may be made.

In the discussion, unless otherwise stated, adjectives such as "substantially" and "about" that modify a condition or relationship characteristic of a feature or features of an embodiment of the present technology, are to be understood to mean that the condition or characteristic is defined to within tolerances that are acceptable for operation of the embodiment for an application for which it is intended.

It is appreciated that certain features of the disclosure, which are, for clarity, described in the context of separate embodiments, may also be provided in combination in a single embodiment. Conversely, various features of the disclosure, which are, for brevity, described in the context of a single embodiment, may also be provided separately or in any suitable subcombination or as suitable in any other described embodiment of the disclosure. Certain features described in the context of various embodiments are not to be considered essential features of those embodiments, unless the embodiment is inoperative without those elements.

Although the present disclosure has been described with respect to various specific embodiments presented thereof for the sake of illustration only, such specifically disclosed embodiments should not be considered limiting. Many other alternatives, modifications and variations of such embodiments will occur to those skilled in the art based upon Applicant's disclosure herein. Accordingly, it is intended to embrace all such alternatives, modifications and variations and to be bound only by the spirit and scope of the disclosure as defined in the appended claims and any change which come within their meaning and range of equivalency.

In the description and claims of the present disclosure, each of the verbs "comprise", "include" and "have", and conjugates thereof, are used to indicate that the object or objects of the verb are not necessarily a complete listing of features, members, steps, components, elements or parts of the subject or subjects of the verb.

As used herein, the singular form "a", "an" and "the" include plural references and mean "at least one" or "one or more" unless the context clearly dictates otherwise. At least one of A and B is intended to mean either A or B, and may mean, in some embodiments, A and B.

Positional or motional terms such as "upper", "lower", "right", "left", "bottom", "below", "lowered", "low", "top", "above", "elevated", "high", "vertical", "horizontal", "backward", "forward", "upstream" and "downstream", as well as grammatical variations thereof, may be used herein for exemplary purposes only, to illustrate the relative positioning, placement or displacement of certain components, to indicate a first and a second component in present illustrations or to do both. Such terms do not necessarily indicate that, for example, a "bottom" component is below a "top" component, as such directions, components or both may be flipped, rotated, moved in space, placed in a diagonal orientation or position, placed horizontally or vertically, or similarly modified.

As used herein, unless otherwise stated, adjectives such as "substantially" and "about" that modify a condition or relationship characteristic of a feature or features of an embodiment of the present technology, are to be understood to mean that the condition or characteristic is defined to within tolerances that are acceptable for operation of the embodiment for an application for which it is intended, or within variations expected from the measurement being performed and/or from the measuring instrument being used. Furthermore, unless otherwise stated the terms used in this disclosure should be construed as having tolerances which may depart from the precise meaning of the relevant term but would enable the invention or the relevant portion thereof to operate and function as described, and as understood by a person skilled in the art.

When the term "about" precedes a numerical value, it is intended to indicate +/−10%, or +/−5%, or even only +/−1%, and in some instances the precise value.

While this disclosure has been described in terms of certain embodiments and generally associated methods, alterations and permutations of the embodiments and methods will be apparent to those skilled in the art. The present disclosure is to be understood as not limited by the specific embodiments described herein.

To the extent necessary to understand or complete the disclosure of the present disclosure, all publications, patents, and patent applications mentioned herein, including in particular the applications of the Applicant, are expressly incorporated by reference in their entirety as is fully set forth herein.

Citation or identification of any reference in this application shall not be construed as an admission that such reference is available as prior art to the disclosure.

The invention claimed is:

1. A printing system comprising:
a writing module;
a member having an imaging surface configured to carry a layer of particles of a radiation modifiable material, the member and the writing module being movable relative to each other;
the writing module comprising a plurality of integrated electronic modules each having an array having a plurality of individually controllable light sources;
each controllable light source comprising a cascade of at least two Vertical-Cavity Surface-Emitting Laser (VCSEL) light-emitting semiconductor junctions connected in series with one another and disposed to emit light along a common axis so as to direct a single beam onto a single spot on the imaging surface;
the plurality of spots from the respective plurality of light sources being spaced from one another in a direction transverse to the direction of movement between the writing module and the imaging surface.

2. The printing system of claim 1, wherein the member is an endless transfer member, movable cyclically through a coating station at which the imaging surface is coated with the particles of the radiation modifiable material, and a transfer station at which only radiation modifiable material residing at spots on the imaging surface irradiated by the writing module and modified thereby, transfer from the imaging surface to a substrate.

3. The printing system of claim 2, wherein the imaging surface is disposed on a first side of the transfer member and the light beams of the writing module are directed onto a second side of the transfer member, opposite the first side.

4. The printing system of claim 1, wherein the radiation modifiable material is pigmented and serves as an ink.

5. The printing system of claim 1, wherein the radiation modifiable material is softened or liquified when irradiated, and serves as an adhesive.

6. The printing system of claim 1, wherein the intensity of each light beam is controllable and is capable of adopting at least three different levels of intensity.

7. The printing system of claim 1, wherein said light sources emit energy at a total power density greater than 20 $MW/m^2$.

8. The printing system of claim 1, wherein each light source is capable of activation and deactivation at a switching rate in excess of 20 kHz.

9. The printing system of claim 1, wherein said light sources on each integrated electronic module are arranged in an array having rows and columns.

10. The printing system of claim 1, wherein the integrated electronic modules are arranged in two rows that are spaced from one another in the direction of movement of the imaging surface, the system further comprising two or more separate packages containing electronic driver circuitry to provide electrical power to the integrated electronic modules, wherein integrated electronic modules that are spaced from one another in the direction of movement of the imaging surface are connected to be powered by different ones of the packages.

11. The printing system of claim 10, wherein the electronic driver circuitry is electrically connected to integrated electronic modules by conductors on a flex circuit.

12. The printing system of claim 10, wherein said integrated electronic modules and said packages of said electronic driver circuitry are thermally coupled to a heatsink.

13. The printing system of claim 1, further comprising an optical system for focusing the light beams emitted by the light sources onto the imaging surface.

14. The printing system of claim 13, wherein said optical system comprises a set of optical lenses, formed as GRIN rods, each lens being configured to focus onto said imaging surface the light beams of all the light sources on a single integrated electronic module.

15. A printing method for selectively modifying particles of a radiation modifiable material coating an imaging surface of a member, the method comprising:
a) moving the member relatively to a writing module, wherein the writing module is configured to direct onto the imaging surface a plurality of individually controllable light beams that are spaced from one another in a direction traverse to the direction of movement of the imaging surface, incidence of a light beam on a spot on the imaging surface serving to modify the particles of the radiation modifiable material carried by the imaging surface at the spot, the writing module comprising a plurality of integrated electronic modules each having an array of individually controllable light sources, each light source producing a respective one of the light beams comprising a cascade of at least two Vertical-Cavity Surface-Emitting Laser (VCSEL) light-emitting semiconductor junctions connected in series with one another and configured to emit light along a common axis so as to direct a single beam onto a single spot on the imaging surface, and
b) displacing the member having spots of irradiation modified material to at least one processing station selected from:
i. a transfer station, wherein the method comprises transferring the irradiation modified material spots from the imaging surface to a printing substrate;
ii. a direct embellishment station, wherein the method comprises applying embellishment particles to the irradiation modified material spots on the imaging surface;
iii. an indirect embellishment station, wherein the method comprises applying embellishment particles to the irradiation modified material spots transferred from the imaging surface to a printing substrate at a transfer station; and
iv. a finishing station located downstream from the last of a transfer station, a direct embellishment station and an indirect embellishment station, with respect to a direction of displacement, wherein the method comprises applying finishing steps to the printing substrate.

16. The printing system of claim 1, wherein each light source further comprises a tunneling diode connected in series between each two VCSEL light-emitting semiconductor junctions of the at least two VCSEL light emitting semiconductor junctions.

17. A writing module, comprising:
a plurality of integrated electronic modules each having an array having a plurality of individually controllable light sources each capable of controllably emitting a light beam directed onto an imaging surface adapted to carry particles of irradiation modifiable material;
each controllable light source comprises a cascade of at least two Vertical-Cavity Surface-Emitting Laser (VCSEL) light-emitting semiconductor junctions connected in series with one another and disposed to emit light along a common axis so as to direct a single beam onto a single spot on the imaging surface;

the writing module and the imaging surface being movable relative to one another, and the light beams of the plurality of light sources are spaced from one another in a direction transverse to the direction of movement of the imaging surface.

18. The printing system as claimed in claim 1, wherein the radiation modifiable material comprises a polymer.

* * * * *